United States Patent
Engle et al.

(10) Patent No.: US 7,337,522 B2
(45) Date of Patent: Mar. 4, 2008

(54) METHOD AND APPARATUS FOR FABRICATING A CIRCUIT BOARD WITH A THREE DIMENSIONAL SURFACE MOUNTED ARRAY OF SEMICONDUCTOR CHIPS

(75) Inventors: Jason Engle, San Clemente, CA (US); Rhandee Abrio, Lake Forest, CA (US); Julie Roslyn Bradbury-Bennett, San Diego, CA (US); Greg Allee, Laguna Hills, CA (US); Kenneth Kledzik, San Clemente, CA (US)

(73) Assignee: Legacy Electronics, Inc., San Clemente, CA (US)

( * ) Notice: Subject to any disclaimer, the term of this patent is extended or adjusted under 35 U.S.C. 154(b) by 0 days.

(21) Appl. No.: 11/270,317

(22) Filed: Nov. 9, 2005

(65) Prior Publication Data

US 2006/0107524 A1    May 25, 2006

Related U.S. Application Data

(63) Continuation-in-part of application No. 10/648,026, filed on Aug. 26, 2006, which is a continuation-in-part of application No. 10/371,061, filed on Feb. 21, 2003, now Pat. No. 7,102,892, and a continuation-in-part of application No. 10/098,269, filed on Mar. 14, 2002, now Pat. No. 7,103,970, which is a continuation of application No. 09/688,500, filed on Oct. 16, 2000, now Pat. No. 6,713,854.

(60) Provisional application No. 60/360,473, filed on Feb. 26, 2002, provisional application No. 60/275,843, filed on Mar. 14, 2001.

(51) Int. Cl.
   *B23P 23/00*    (2006.01)

(52) U.S. Cl. .................. 29/564.1; 29/739; 29/740; 29/741

(58) Field of Classification Search ............... 29/564.1, 29/740, 741, 739
See application file for complete search history.

(56) References Cited

U.S. PATENT DOCUMENTS 3,239,719 A    3/1966    Shower (Continued)

FOREIGN PATENT DOCUMENTS

DE    198 45 316 A1    2/1999

(Continued)

OTHER PUBLICATIONS

30(8) IBM Tech. Discl. Bull. 373-4 (1988).

*Primary Examiner*—Carl J. Arbes
(74) *Attorney, Agent, or Firm*—Dewey & LeBoeuf, LLP

(57) ABSTRACT

A method and apparatus for fabricating a three dimensional array of semiconductor chips is disclosed. The method uses a multiple step fabrication process that automates the surface mounting of semiconductor chips with unique chip carriers to achieve the three dimensional array of chips. The method can include the steps of depositing solder on one or more chip modules, placing and interconnecting low-cost components on the chip modules, and storing the preprocessed chip modules in pallets or in a tape and reel. Later these chip carriers may then be mounted on a circuit board, possibly over; for example, low and/or high cost components and then populated with low and/or high cost components. The apparatus includes a unique stackable chip module pallet and print fixture pedestal.

14 Claims, 21 Drawing Sheets

U.S. PATENT DOCUMENTS

| | | |
|---|---|---|
| 3,665,256 A | 5/1972 | Goun et al. |
| 3,737,986 A | 6/1973 | Cranston |
| 3,777,221 A | 12/1973 | Tatusko et al. |
| 4,038,488 A | 7/1977 | Lin |
| 4,245,877 A | 1/1981 | Auriana |
| 4,288,841 A | 9/1981 | Gogal |
| 4,322,778 A | 3/1982 | Barbour et al. |
| 4,398,235 A | 8/1983 | Lutz et al. |
| 4,437,235 A | 3/1984 | McIver |
| 4,549,200 A | 10/1985 | Ecker et al. |
| 4,616,655 A | 10/1986 | Weinberg et al. |
| 4,632,293 A | 12/1986 | Feinstein |
| 4,763,188 A | 8/1988 | Johnson |
| 4,802,062 A | 1/1989 | Blum et al. |
| 4,970,577 A * | 11/1990 | Ogihara et al. ............. 257/698 |
| 4,982,265 A | 1/1991 | Watanabe et al. |
| 5,061,990 A | 10/1991 | Arakawa et al. |
| 5,107,586 A | 4/1992 | Eichelberger et al. |
| 5,128,831 A | 7/1992 | Fox, III et al. |
| 5,130,894 A | 7/1992 | Miller |
| 5,191,404 A | 3/1993 | Wu et al. |
| 5,239,198 A | 8/1993 | Lin et al. |
| 5,239,447 A | 8/1993 | Cotues et al. |
| 5,241,456 A | 8/1993 | Marcinkiewicz et al. |
| 5,262,594 A | 11/1993 | Edwin et al. |
| 5,285,352 A | 2/1994 | Pastore et al. |
| 5,299,094 A | 3/1994 | Nishino et al. |
| 5,311,401 A | 5/1994 | Gates, Jr. et al. |
| 5,311,407 A | 5/1994 | Lumbard |
| 5,313,366 A | 5/1994 | Gaudenzi et al. |
| 5,316,787 A | 5/1994 | Frankeny et al. |
| 5,376,825 A * | 12/1994 | Tukamoto et al. .......... 257/685 |
| 5,377,077 A | 12/1994 | Burns |
| 5,394,300 A | 2/1995 | Yoshimura |
| 5,400,904 A | 3/1995 | Maston, III et al. |
| 5,412,538 A | 5/1995 | Kikinis et al. |
| 5,418,688 A | 5/1995 | Hertz et al. |
| 5,450,283 A | 9/1995 | Lin et al. |
| 5,479,318 A | 12/1995 | Burns |
| 5,492,223 A | 2/1996 | Boardman et al. |
| 5,498,906 A | 3/1996 | Roane et al. |
| 5,514,907 A | 5/1996 | Moshayedi |
| 5,570,274 A | 10/1996 | Saito et al. |
| 5,575,688 A * | 11/1996 | Crane, Jr. ................... 439/660 |
| 5,579,207 A | 11/1996 | Hayden et al. |
| 5,634,821 A * | 6/1997 | Crane, Jr. ................... 439/660 |
| 5,656,856 A | 8/1997 | Kweon |
| 5,677,569 A | 10/1997 | Choi et al. |
| 5,701,233 A | 12/1997 | Carson et al. |
| 5,739,581 A | 4/1998 | Chillara et al. |
| 5,742,097 A | 4/1998 | Matsunaga et al. |
| 5,744,827 A | 4/1998 | Jeong et al. |
| 5,744,862 A | 4/1998 | Ishii |
| 5,754,408 A | 5/1998 | Derouiche |
| 5,757,079 A | 5/1998 | McAllister et al. |
| 5,783,870 A | 7/1998 | Mostafazadeh et al. |
| 5,790,378 A | 8/1998 | Chillara |
| 5,798,014 A | 8/1998 | Weber |
| 5,810,609 A | 9/1998 | Faraci et al. |
| 5,869,353 A | 2/1999 | Levy et al. |
| 5,869,356 A | 2/1999 | Fuller, Jr. et al. |
| 5,910,885 A | 6/1999 | Gulachenski et al. |
| 5,982,633 A | 11/1999 | Jeansonne |
| 6,014,316 A | 1/2000 | Eide |
| 6,028,352 A | 2/2000 | Eide |
| 6,038,132 A | 3/2000 | Tokunga et al. |
| 6,049,972 A | 4/2000 | Link et al. |
| 6,072,122 A | 6/2000 | Hosoya |
| 6,081,429 A | 6/2000 | Barrett |
| 6,084,293 A | 7/2000 | Ohuchi |
| 6,084,780 A | 7/2000 | Happoya |
| 6,093,249 A | 7/2000 | Curtin |
| 6,097,086 A * | 8/2000 | Crane et al. ................. 257/692 |
| 6,101,100 A | 8/2000 | Londa |
| 6,107,683 A | 8/2000 | Castro et al. |
| RE36,916 E | 10/2000 | Moshayedi |
| 6,160,718 A | 12/2000 | Vakilian |
| 6,214,640 B1 | 4/2001 | Fosberry et al. |
| 6,222,739 B1 | 4/2001 | Bhakta et al. |
| 6,262,488 B1 | 7/2001 | Masayuki et al. |
| 6,291,259 B1 | 9/2001 | Chun |
| 6,313,522 B1 | 11/2001 | Akram et al. |
| 6,313,524 B1 | 11/2001 | Pueschner et al. |
| 6,320,757 B1 | 11/2001 | Liu |
| 6,363,846 B1 | 4/2002 | Murakami |
| 6,388,335 B1 | 5/2002 | Lam |
| 6,404,043 B1 | 6/2002 | Isaak |
| 6,428,650 B1 | 8/2002 | Chung |
| 6,445,591 B1 | 9/2002 | Kwong |
| 6,462,284 B1 | 10/2002 | Hashimoto |
| 6,469,376 B2 | 10/2002 | Vaiyapuri |
| 6,472,735 B2 | 10/2002 | Isaak |
| 6,559,539 B2 | 5/2003 | Tu et al. |
| 6,566,746 B2 | 5/2003 | Isaak et al. |
| 6,566,760 B1 | 5/2003 | Kawamura et al. |
| 6,577,003 B1* | 6/2003 | Crane et al. ................. 257/738 |
| 6,614,110 B1 | 9/2003 | Pace |
| 6,618,267 B1 | 9/2003 | Dalal et al. |
| 6,627,984 B2 | 9/2003 | Bruce et al. |
| 6,628,527 B2 | 9/2003 | Muramatsu et al. |
| 6,665,194 B1 | 12/2003 | Patel et al. |
| 6,683,377 B1 | 1/2004 | Shim et al. |
| 6,777,798 B2 | 8/2004 | Fukumoto et al. |
| 6,828,666 B1 | 12/2004 | Herrell et al. |
| 6,924,556 B2 | 8/2005 | Cha |
| 2002/0088355 A1 | 7/2002 | Comulada, Jr. et al. |
| 2003/0122240 A1 | 7/2003 | Lin et al. |
| 2003/0137808 A1 | 7/2003 | Kledzik et al. |
| 2003/0168725 A1 | 9/2003 | Warner et al. |
| 2003/0201526 A1 | 10/2003 | Bolken et al. |

FOREIGN PATENT DOCUMENTS

| | | |
|---|---|---|
| EP | 0 714 231 A2 | 5/1996 |
| JP | 08-051183 | 2/1996 |
| JP | 09-245926 | 9/1997 |
| JP | 10-074769 | 3/1998 |
| JP | 11-111914 | 4/1999 |
| JP | 2000-031617 | 2/2000 |
| JP | 2003-521806 | 7/2003 |
| WO | WO 00/35016 | 6/2000 |
| WO | WO 00/65652 | 11/2000 |
| WO | WO 00/68996 | 11/2000 |
| WO | WO 01/48819 | 7/2001 |
| WO | WO 01/69680 | 9/2001 |

* cited by examiner

METHOD AND APPARATUS FOR FABRICATING A CIRCUIT BOARD WITH A THREE DIMENSIONAL SURFACE MOUNTED ARRAY OF SEMICONDUCTOR CHIPS

CROSS REFERENCE TO RELATED APPLICATIONS

The present application is a continuation-in-part of and claims priority under 35 U.S.C. § 120 to U.S. patent application Ser. No. 10/098,269 filed Mar. 14, 2002 now U.S. Pat. No. 7,103,970, and entitled "A Method for Fabricating a Circuit Board with a Three Dimensional Surface Mounted Array of Semiconductor Chips," which claims priority under 35 U.S.C. § 119(e) to U.S. provisional patent application Ser. No. 60/275,843 filed Mar. 14, 2001. The present application is a continuation-in-part of and claims priority under 35 U.S.C. § 120 to U.S. patent application Ser. No. 10/371,061 filed Feb. 21, 2003 now U.S. Pat. No. 7,102,892, and entitled "Modular Integrated Circuit Chip Carrier," which claims priority under 35 U.S.C. § 119(e) to U.S. provisional patent application Ser. No. 60/360,473 filed Feb. 26, 2002. The present application is also a continuation-in-part and claims priority under 35 U.S.C. § 120 to U. S. patent application Ser. No. 10/648,029 filed Aug. 26, 2003, and entitled "Carrier-based Electronic Module," which is a continuation of U.S. patent application Ser. No. 09/688,500, filed Oct. 16, 2000, now U.S. Pat. No. 6,713,854. All applications and patents from which priority is claimed are incorporated herein by reference in their entirety.

FIELD OF THE INVENTION

The present invention relates to a semiconductor manufacturing process or electronics surface mount assembly process, and more particularly, to a method and system for fabricating semiconductor chips in a three dimensional array on a printed circuit board.

BACKGROUND OF THE INVENTION

Semiconductor chips are typically connected to a printed circuit board that, in turn, interconnects the chips to the rest of circuitry with which the chips will operate, including other chips on the printed circuit board. In the past, the chips were spread out across the printed circuit board on their large flat sides in a simple two dimensional array. Over the years, the trend in the computer industry has been towards more densely packed printed circuit boards. Among the causes for this are the increasing demand for larger random access computer memories, faster computers, more compact computers, and a push to decrease costs of printed circuit boards by increasing the circuit density on the printed circuit board. In the mid-to-late 1980s, the industry switched over from a technology that attached computer chips to a printed circuit board through holes in the printed circuit board to one that used surface mounting technology. With the advent of surface mount technology, conventional through-holes on printed circuit boards have been replaced with conductive mounting pads on the surface of the printed circuit board. This allows for multiple layered circuit boards with a complex network of interconnect lines running between the layers of the board. In turn, this has allowed for the increase in the density of chips on a printed circuit board that not only decreases the size of the board, but also increases the operating speed of the computer by reducing the distance signals have to travel between chips on the board.

The move to surface mount technology has consequently resulted in the practice of positioning chips on a printed circuit board in a variety of configurations to increase chip density on the circuit board, and thereby decrease the distance between the chips to speed up operation of the overall system. Generally, conventional configurations stack the chips on one another to increase density. The practice of stacking the chips on one another is particularly adaptable to memory chips given the redundancies in their circuits. Up until the present, in order for the chips to be stacked on one another to increase chip density and achieve a three dimensional array on a circuit board, computer makers had to send chips to a third-party manufacturer that specialized in the technique of permanently bonding chips in a stacked fashion. Stacking the chips generally consisted of soldering them together. This, in turn, created a variety of problems including time delays inherent in having to rely on an outside manufacturing facility, and potential damage to the chip as a result of directly soldering the chips together.

Recent developments, in particular, those of the applicant of the present invention have resulted in new and much more efficient means for stacking chips on a printed circuit board in a three dimensional array. These developments are described in detail in U.S. Patents owned by the applicant herein, namely: U.S. Pat. No. 6,313,998 for a "Circuit Board Assembly Having a Three-Dimensional Array of Integrated Circuit Packages," filed Apr. 2, 1999, and U.S. Pat. No. 6,487,078 for an "Electronic Module Having a Three-Dimensional Array of Carrier-Mounted Integrated Circuit Packages," filed Mar. 13, 2000. Both of these U.S. Patents are incorporated herein by reference in their entirety and made part hereof as if set forth herein at length. The two referenced U.S. Patents describe a unique electronic module that, in effect, provides a platform that is placed over a chip on a circuit board and connects to contact pads on the circuit board that the platform shares with the chip underneath it. The second chip is then connected to the top of the platform to achieve a stacked three-dimensional array, as more fully described in the above referenced U.S. Patents. One variation of a chip carrier described and claimed in the above referenced U.S. Patents and is depicted in FIG. 1. There are a variety of chip carrier styles and designs. These styles and designs may be fabricated with a number of techniques. For example a chip carrier may be configured as a printed circuit board as shown in FIG. 4 of U.S. patent application Ser. No. 10/371,061. As another example, a chip carrier may be molded from a packaging process as depicted in FIG. 21B of U.S. patent application Ser. No. 10/371,061.

To maximize the advantages of the electronic chip carrying modules, the present invention provides, for example, a manufacturing process and apparatus that may automate and optimize their installation. Additionally, it should, for example, preferably be a manufacturing process and apparatus that may be used in-house by a surface mount assembly, computer or circuit board manufacturer without the need to use the services of a third-party manufacturer.

SUMMARY OF THE INVENTION

It is the object of an embodiment of the present invention to provide, for example, an efficient and cost effective manufacturing process and apparatus that allows placing chips in a three dimensional array on a printed circuit board. It is a further object of an embodiment of the present invention to provide, for example, an apparatus and method that can be utilized with current methods and semiconductor or surface mount assembly manufacturing machines used in the assembly of printed circuit boards.

These and other objects of certain embodiments of the present invention are achieved by, for example, providing a method for populating a circuit board with a three dimensional array of semiconductor chips with the following steps: a) verifying that electrical contacts on a plurality of chip carriers are properly aligned for an assembly process; b) preparing a chip receiving side of the chip carriers to receive a chip and passive components; c) preparing a circuit board for a chip assembly process; d) populating the circuit board with a first layer of chips and passive components, wherein the chips and passive components are positioned to make contact with pre-selected and predetermined electrical contact points; e) positioning the chip carriers over the first layer of chips so that the chip carriers make contact with pre-selected electrical contact points on the circuit board; f) placing on each of the chip carriers a semiconductor chip with passive components; and g) interconnecting in a permanent fashion the chips, passive components, and chip carriers to the circuit board.

Another aspect of an embodiment of the invention provides, for example, a system for populating a circuit board with a three dimensional array of semiconductor chips comprising: a) a plurality of chip carriers attachable to a circuit board with space for a chip to be positioned directly on the circuit board beneath each chip carrier, as well as for positioning a chip on top of the chip carrier to thereby create a three dimensional array of chips on the circuit board; b) a pallet for holding and moving a plurality of chip carriers during a circuit board assembly process, the pallet having a matrix of chambers in a frame like form with the chambers being open at least at a top side of the pallet, each chamber being formed to hold a chip carrier during the circuit board assembly process, the chip carriers being positioned in each of the chambers of the pallet with a top, chip receiving side of the chip carrier facing out from the top of the pallet to thereby make the top side of the chip carrier accessible during the circuit board assembly process; and c) a mechanism to move and position the pallet during the assembly process so that the plurality of chip carriers held by the pallet can be prepared to receive a chip during the assembly process, easily accessed, removed from the pallet, and positioned on the circuit board over chips positioned directly on the circuit board with chips positioned on each chip carrier to thereby create a three dimensional array of chips on the circuit board.

Another aspect of an embodiment of the invention provides, for example, an apparatus for positioning and securely, but detachably holding a chip module during a semiconductor or surface mount assembly process This process may include, for example: a) a pallet for holding chip modules, the pallet having a two dimensional matrix of chambers, the chambers being open at first and second opposing parallel sides of the pallet, the chambers having, at a base adjacent to the opening on the second side of the pallet, a flange around the inside of the chamber to allow the chamber to retain a chip module of approximately the same dimensions as the chamber when the first side of the pallet faces up; b) a print fixture pedestal with a two dimensional matrix of raised portions that match the matrix of the chambers of the pallet such that the raised portions are sized such that the raised portions fit on a one-for-one basis into the chambers of the pallet from the second side of the pallet; and c) wherein when the chambers are filled with chip modules and the print fixture pedestal is joined with the pallet at the pallet's second side, the raised portions elevate chip modules located in the chambers to a work position from which they can be worked on from the first side of the pallet.

Another embodiment of the invention provides, for example, an apparatus for positioning and securely, but detachably holding a chip module during a surface mount assembly process. This embodiment includes, for example: a) a pallet for holding chip modules, the pallet having a two dimensional matrix of chambers, the chambers being open at first and second opposing parallel sides of the pallet, the chambers on the first side of the pallet embedded in a ridge with pins left and right of the chamber, to retain a chip module on the first side of the pallet; b) a print fixture pedestal with a single planar surface to match a single recessed flange surrounding the matrix of the chambers on the lower side of the pallet, such that the planar pedestal may be sized to fit into the second side of the pallet; and c) wherein when the upper chambers hold chip modules and the print fixture pedestal is joined with the pallet at the pallet's second side, the raised portion may apply indirectly a vacuum to the chip modules located on the chambers, holding them to the pallet so they can be worked on from the first side of the pallet.

Another embodiment of the invention provides, for example, a method for partially pre-processing the "chip carrier" (e.g., canopy™) and packing it in tape and reel, the partially pre-processing comprising: a) application of solder or equivalent material to chip carrier land patterns for only those devices, such as resistors or capacitors, having no solder or insufficient solder on their terminations for formation of acceptable electrical interconnections during a heating process such as, for example, a reflow process; b) placing devices selected for pre-processing on the chip carrier and forming interconnections, for example, solder joints; c) application of tacky flux to the remaining unpopulated carrier land patterns, such as, for example, ball-grid array (BGA) chips, chip-scale packages, flip-chips, various packaged or unpackaged integrated circuits, canopies,™ or other chip carrier; and d) packing the partially pre-processed chip carrier in tape and reel.

Another embodiment of the present invention provides, for example, a method for partially pre-processing the "chip carrier" (e.g., canopy™) and placing it in tape and reel, the processing comprising: a) application of solder or other material to a chip carrier receiving side land patterns; b) placement of devices, such as resistors or capacitors, to be added during the partial pre-processing and forming interconnections; c) optional flattening of the unpopulated solder deposits; d) application of tacky flux to the flattened unpopulated chip carrier land patterns, such as BGA chips, chip-scale packages, flip-chips, other packaged or unpackaged integrated circuits, canopies,™ or other chip carrier; and d) packing the partially pre-processed chip carrier in tape and reel.

Another embodiment of the invention provides, for example, a method for partially pre-processing a chip carrier (e.g., canopy™) and packing it in a protective pallet, the processing comprising: a) application of solder or other material to chip carrier land patterns for only those devices, such as resistors or capacitors, to be added during the partial pre-processing. These devices may be used in this process because they have no solder or insufficient solder on their terminations for formation of acceptable electrical interconnections during a heating process such as, for example, a reflow process; b) placing devices selected in step (a) or for pre-processing on the chip carrier and forming interconnections, for example, solder joints; c) application of tacky flux to the remaining unpopulated carrier land patterns, such as for example, BGA chips, chip-scale packages, flip-chips, various packaged or unpackaged integrated circuits, canopies,™ or other chip carrier; and d) packing the partially processed chip carrier in the protective pallet.

Another embodiment of the present invention provides, for example, a method for pre-processing a chip carrier or interposer (e.g., canopy™) and placing it in a protective pallet, the processing comprising: a) application of solder or other material to a chip carrier receiving side land patterns; b) placement of devices, such as resistors or capacitors, to be added during the partial pre-processing and forming interconnections; c) optional flattening of the unpopulated solder deposits; d) application of tacky flux to the flattened unpopulated chip carrier land patterns, such as BGA chips, chip-scale packages, flip-chips, other packaged or unpackaged integrated circuits, canopies,™ or other chip carrier; and e) packing the partially processed carrier in the protective pallet.

Another embodiment of the present invention provides, for example, a method for populating a circuit board with a three dimensional array of semiconductor chips comprising the steps of: a) placing tape and reel or protective pallet containing, for example, partially pre-processed chip carriers on a surface mount technology placement machine; b) picking up the partially pre-processed chip carrier with a nozzle; c) placing the partially pre-processed chip carrier over an integrated circuit chip and passive devices that have been placed directly on a circuit board; d) placing another integrated circuit chip on the first partially pre-processed chip carrier and soldering.

Another embodiment of the present invention provides, for example, a method for populating a circuit board with a three dimensional array of semiconductor chips comprising the steps of: a) placing tape and reel or protective pallet containing partially pre-processed chip carriers on a surface mount technology placement machine; b) picking up the pre-partially processed chip carrier with a nozzle; c) placing the partially pre-processed chip carrier over an integrated circuit chip and passive devices that have been placed directly on a circuit board; d) placing integrated circuit chip(s) on the receiving side of the chip carrier; e) placing another partially pre-processed chip carrier on the previous pre-processed chip carrier; f) placing integrated circuit chip(s) on the uppermost partially processed chip carrier; g) repeating steps d) and e) as desired and soldering.

BRIEF DESCRIPTION OF THE DRAWINGS

The invention will be better understood by an examination of the following description, together with the accompanying drawings, in which.

DETAILED DESCRIPTION OF THE INVENTION

Figure 1:
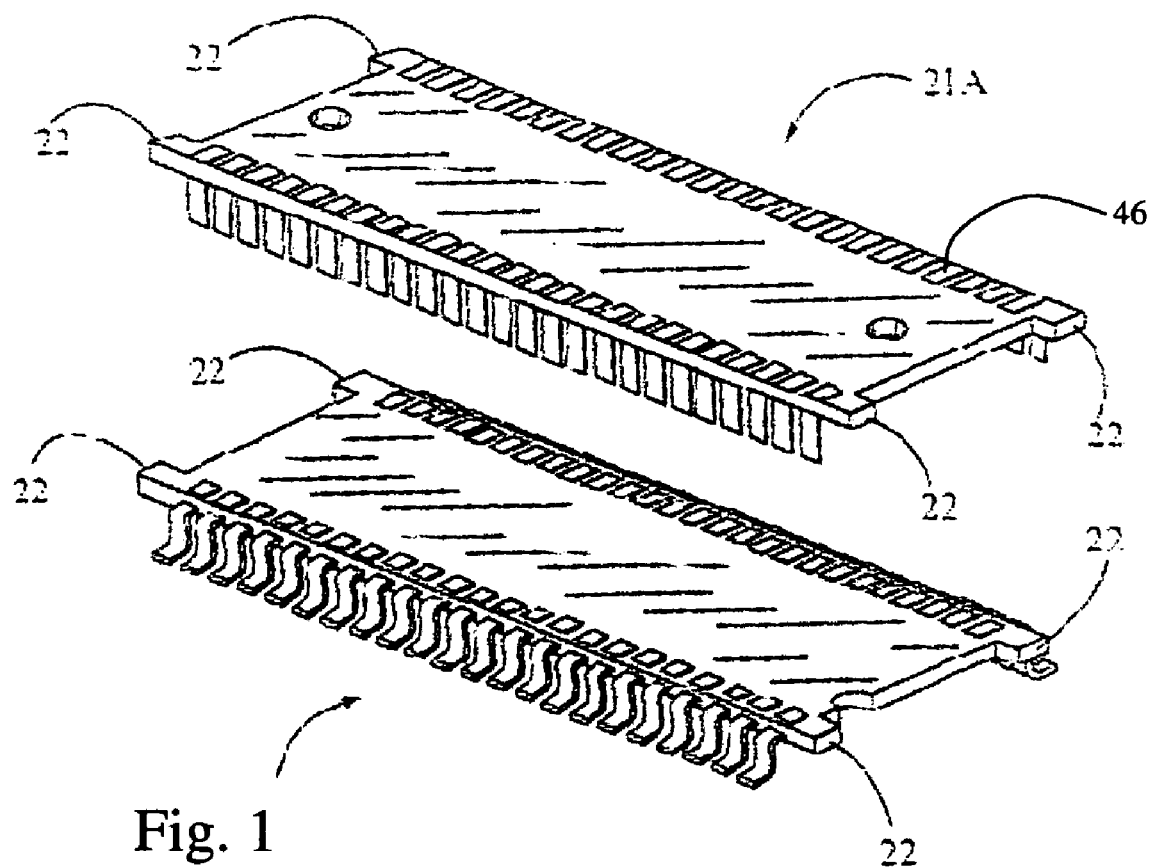
FIG. 1 depicts two different versions of embodiments of electronic chip carriers.

The method of a preferred embodiment of the present invention uses, for example, a three-step fabrication process that automates the surface mounting on a printed circuit board of the chip carriers similar to those depicted as 21A and 21B in FIG. 1 and as described in the two U.S. Patents referenced above that have already been incorporated herein by reference in their entirety. The first step may involve, for example, stenciling (the depositing of solder paste) on a large number of chip carriers 21 at once. The second step, may involve, for example moving the chip carriers to an assembly stage where they are placed on the circuit board over the chips and passive devices that have been placed directly onto the circuit board. Chips, together with appropriate passive devices, can then be placed on the chip carriers. In the third and final stage, the circuit board with components attached can be passed through a single a heating process such as, for example, a reflow process to complete permanent interconnection with solder of the various components on the board and chip carriers.

Figure 2A:
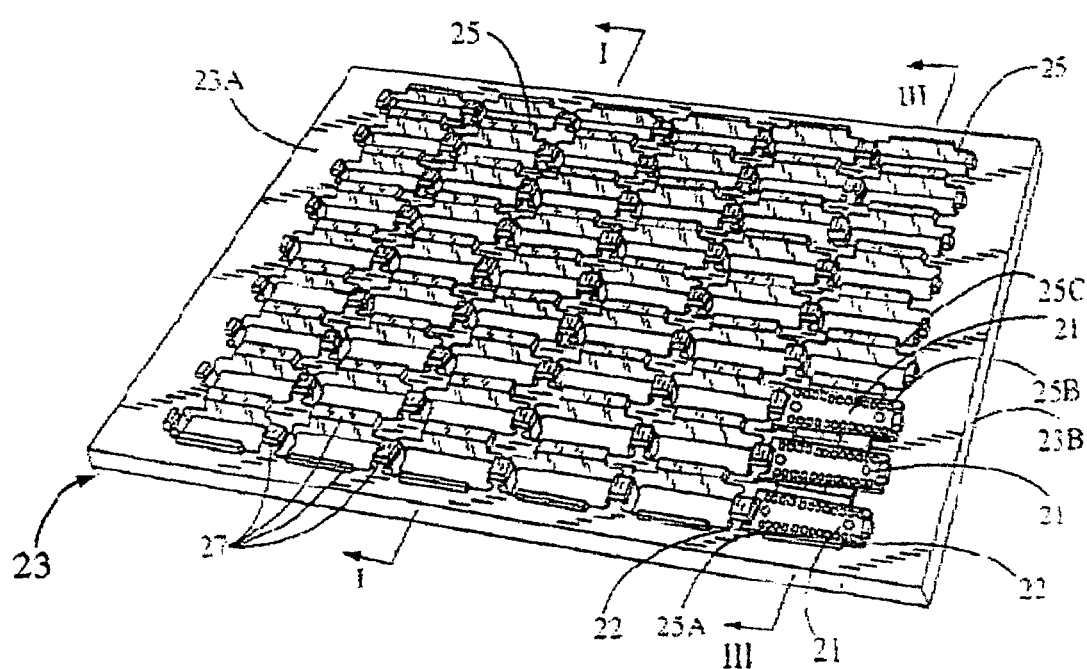
FIG. 2A is a raised perspective view of a pallet embodiment that holds electronic chip carriers during the manufacturing process of an embodiment of the present invention.

A preferred embodiment of the present invention may use, for example, two new devices to aid in the movement and stenciling of a large number of chip carriers at one time. During the fabrication process the chip carriers 21, for example, are held by a chip carrier pallet 23 as depicted in FIG. 2A. This preferred embodiment of pallet 23 as depicted has a total of fifty-four exemplified chambers 25, each one of which holds a chip carrier 21. In FIG. 2A only chambers 25A, 25B and 25C have chip carriers 21. Each of the chambers 25 in pallet 23 are open at the top 23A and bottom 23B of the pallet. The size of each of the example chip carriers are approximately the same size as each chamber 25 in pallet 23 with the exception of four corner projections or flanges 22 on chip carriers 21. Each chip carrier is thus sized such that when a chip carrier is positioned in a chamber 25, the flanges 22 project beyond the chamber and rest on the top surface 23A of the pallet as demonstrated by 25A, 25B and 25C in FIG. 2A. Thus, each chip is prevented from falling through chamber 25 when placed in the chamber.

Figure 2B:
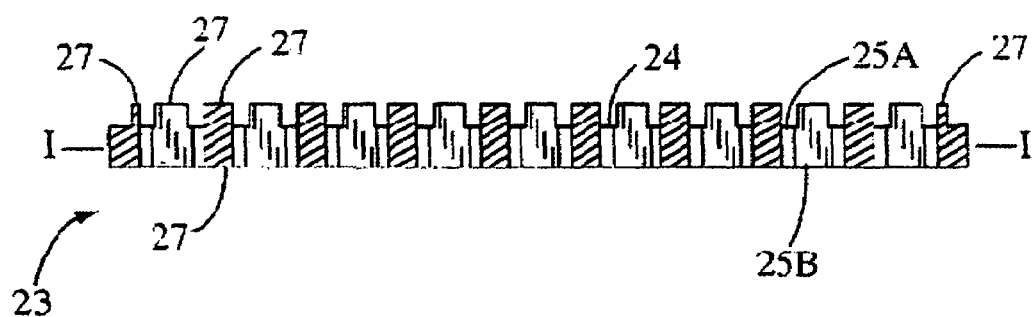
FIG. 2B is a cross-sectional view of a pallet, as, for example, depicted in FIG. 2A along line I-I.

Each chamber 25 in this preferred embodiment has four abutments 27 around the top outside edge as depicted in FIG. 2A. The abutments 27 are designed to hold the chip carriers 21 and protect the chip carriers when positioned in a chamber 25. The abutments 27 provide protection because a chip carrier 21, when positioned in a chamber 25, is located in a recessed position below the top of the surrounding abutments 27. The pallet 23 can be made of a variety of materials including, for example, durable plastic, aluminum or any other suitable material. FIG. 2B is a cross-sectional view of the pallet along line I-I that clearly shows the open tops 23A and bottoms 23B of chambers 25. The abutments 27 protect the top of each chip carrier 21 during the fabrication process while the chip carriers are in the chambers 25 of pallet 23. The tops of the chip carriers 21 are protected so that after solder paste is deposited on top of the carrier, as, for example, will be described below; the pallets can be stacked and moved about without disturbing the solder paste on top of the chip carriers.

Figure 3A:
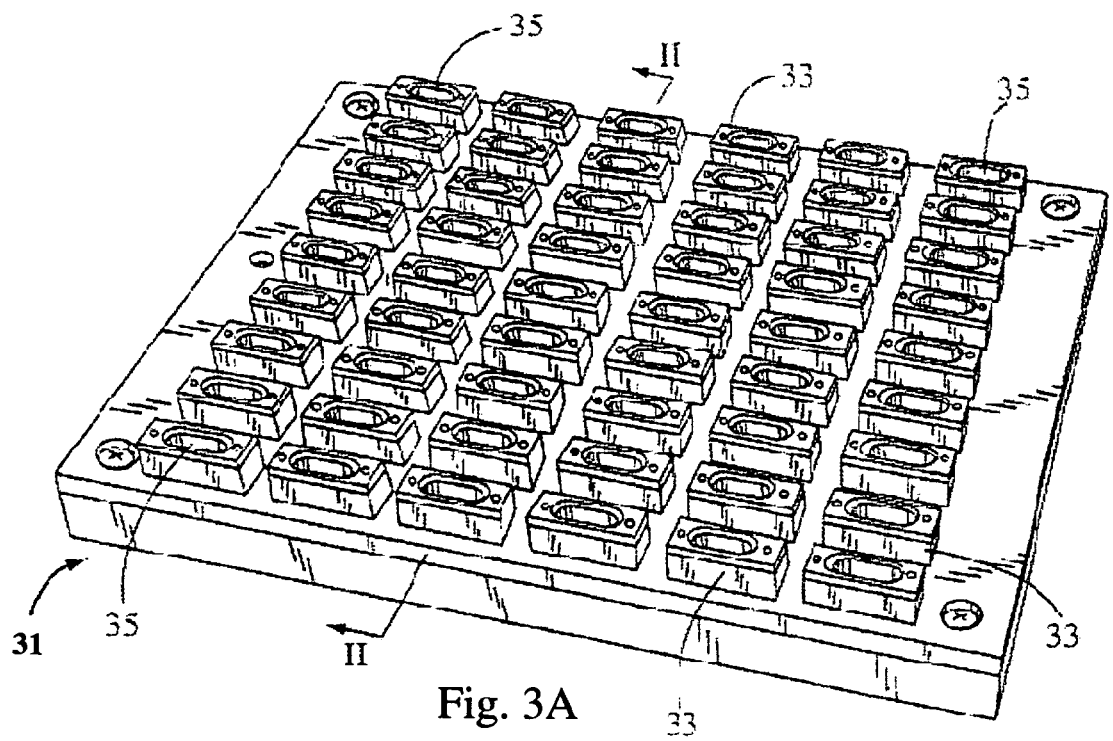
FIG. 3A is a raised perspective view of a print fixture pedestal of an embodiment of the present invention used in the stenciling step of the chip carriers.
Figure 3B:
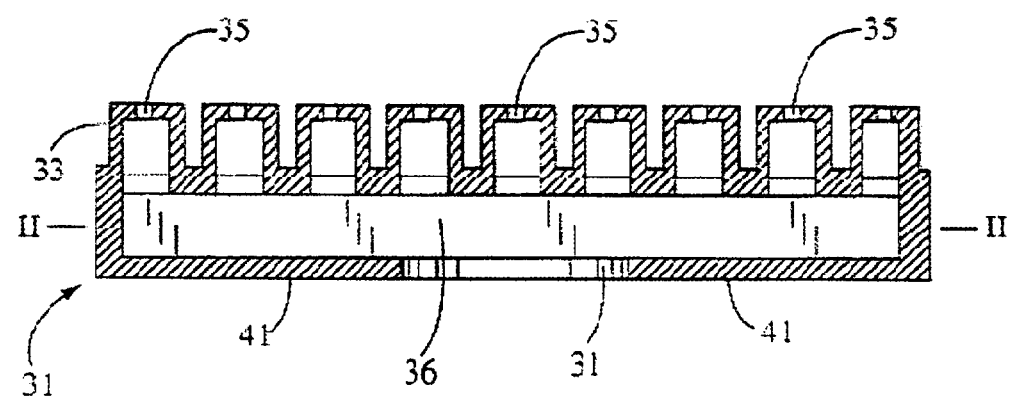
FIG. 3B is a cross-sectional view of a print fixture pedestal as, for example, depicted in FIG. 3A along line II-II.
Figure 4:
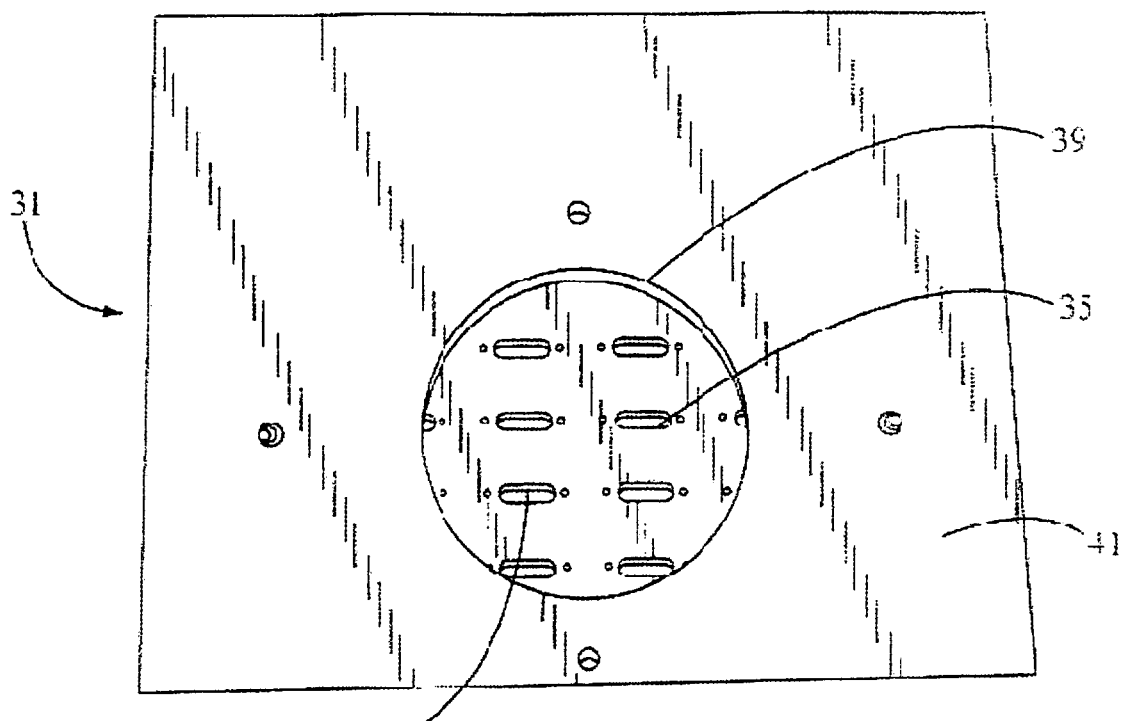
FIG. 4 is a view of the bottom of a print fixture pedestal of an embodiment of the present invention.

The second new device is the print fixture pedestal 31 shown in a raised perspective view in FIG. 3A. The print fixture pedestal 31 has series of raised block like areas 33. The block like areas 33 are in a nine-by-six matrix that matches the nine-by-six matrix of chambers 25 of pallet 23. The matrix of raised areas 33 are designed and sized to fit into the bottom of the corresponding chamber 25 in the pallet 23. Print fixture pedestal 31 is hollow inside and each raised block area 33 has a top opening 35 that opens into the hollow interior of print fixture pedestal 31. FIG. 4 provides a bottom view of the print fixture pedestal 31. Some of the top openings 35 can be seen through circular opening 39 of the bottom plate 41 of the print fixture pedestal 31. FIG. 3A is a cross-sectional view of print fixture pedestal 31 along line II-II of FIG. 3A. The hollow interior 36 can be seen in FIG. 3B. The bottom plate 41 secures to a movable hollow shaft, not shown. The hollow portion of the shaft opens into the hollow interior 36 of print fixture pedestal 31. Print fixture pedestal 31 can be made of cast aluminum or any other suitable material.

Figure 6A:
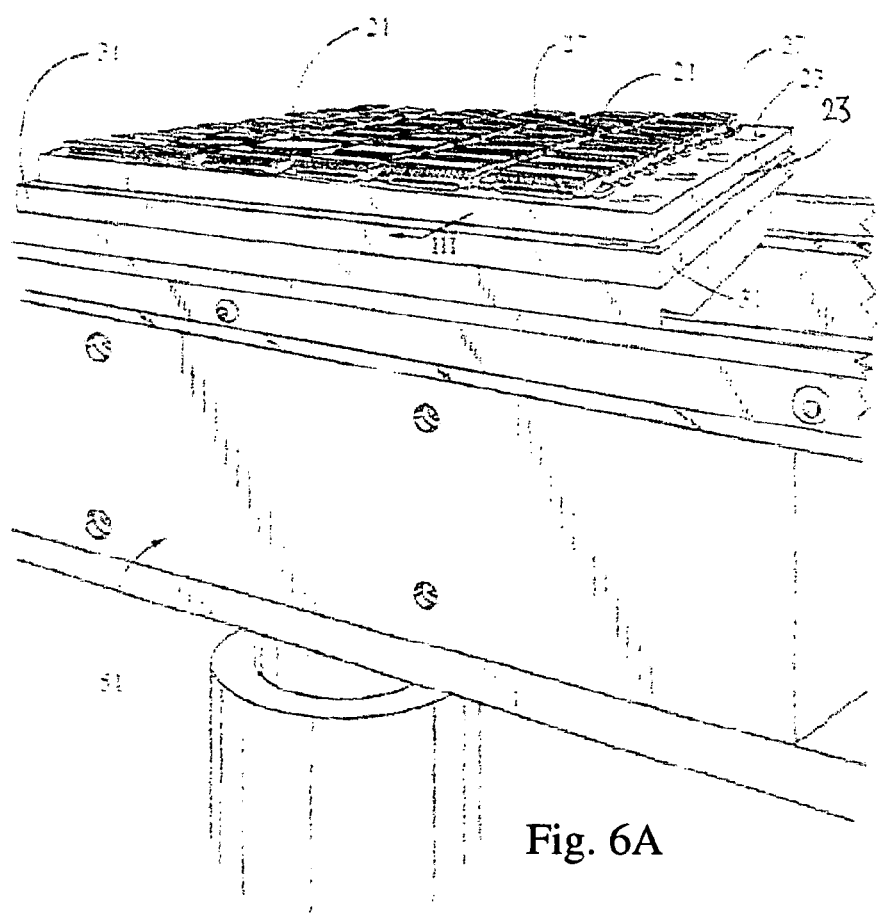
FIG. 6A is a side view of a pallet and print fixture pedestal joined together during one of the stages of the manufacturing process of an embodiment of the present invention.
Figure 6B:
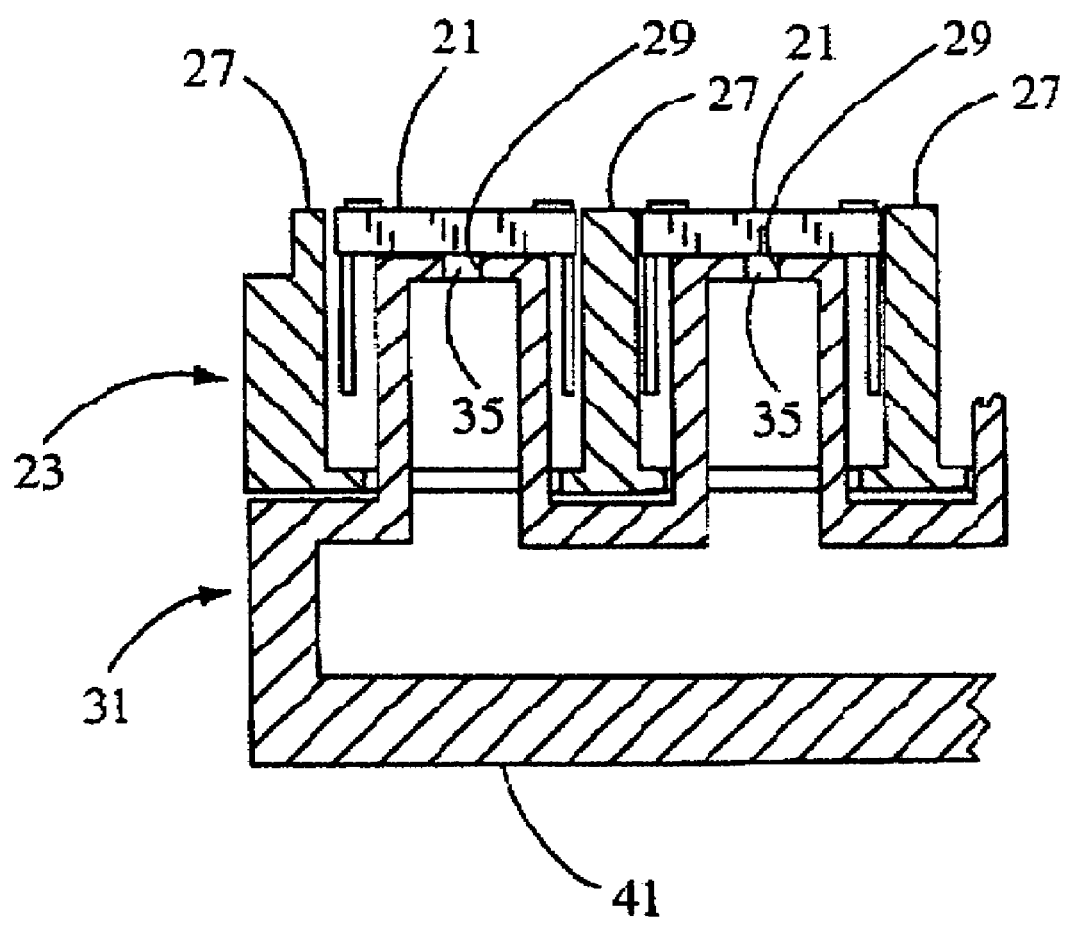
FIG. 6B is a cross-sectional view of one chamber of a pallet, as, for example, depicted in FIG. 1 along line III-III, with a raised portion that supports a chip carrier.

Print fixture pedestal 31 is designed to fit like a glove into the bottom of pallet 23, and raise and secure the chip carriers 21 in the chambers 25 of pallet 23. When print fixture pedestal 31 is joined with pallet 23 (FIGS. 6A and 6B), top openings 35 are flush against the bottoms of the chip carriers located in chambers 25, and a sealed space 36 is created in print fixture pedestal 31 to create a slight vacuum to hold chip carriers 21 during the stenciling process, as will be explained in more detail below. FIG. 6B is a cross-section along line III of FIG. 6A of one chamber 25 with a raised portion 33 inserted to support a chip carrier 21. As can be seen, raised area 33 positioned in a chamber 25 has its top opening 35 flush against the bottom 29 of a chip carrier 21.

Figure 5:
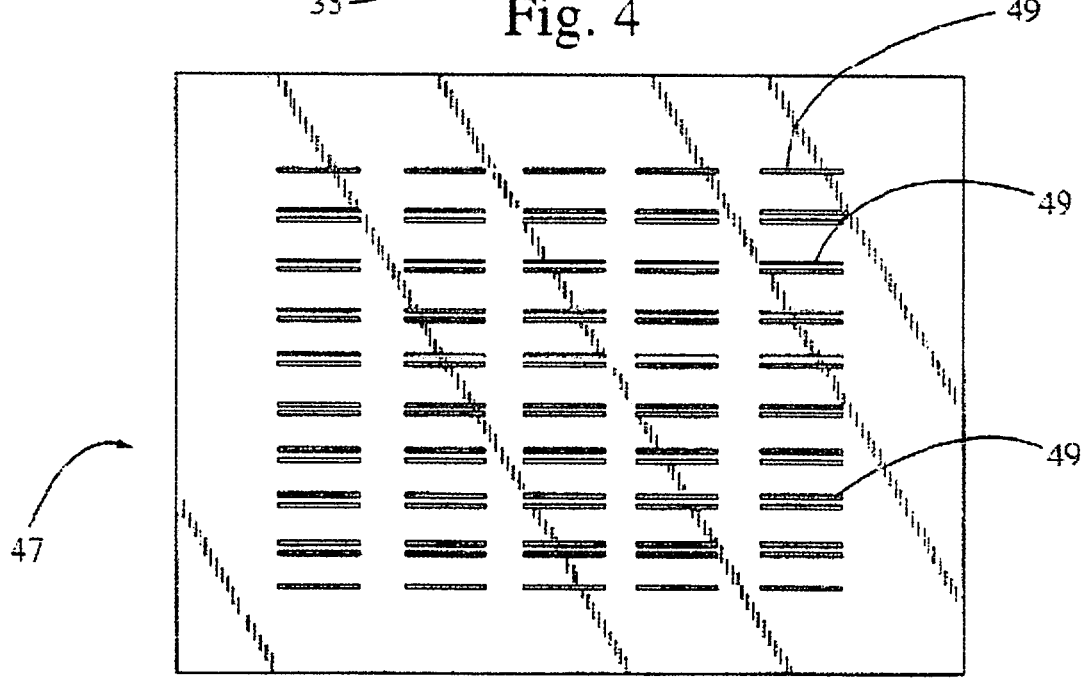
FIG. 5 is top view of a stencil used in the manufacturing process of an embodiment of the present invention.

FIG. 5 provides a top view of a stencil 47 used in an embodiment of the stenciling process. Stencil 47 is a template used to deposit solder on the connector pads 46 (FIG. 1 and FIG. 2A) of the chip carriers 21 when chip carriers are positioned in the chambers 25 of pallet 23, and when chip carriers 21 are securely held by the print fixture pedestal 31. As will be shown below, stencil 47 is placed over the pallet 23 when it is filled with chip carriers 21. The matrix of rows of holes 49 on stencil 47 match up with the contact pads 46 on top of the chip carriers in each of the chambers 25 of the pallet 23. Stencil 47 is usually a made of a sheet of stainless steel or some other similarly suitable material.

Figure 7:
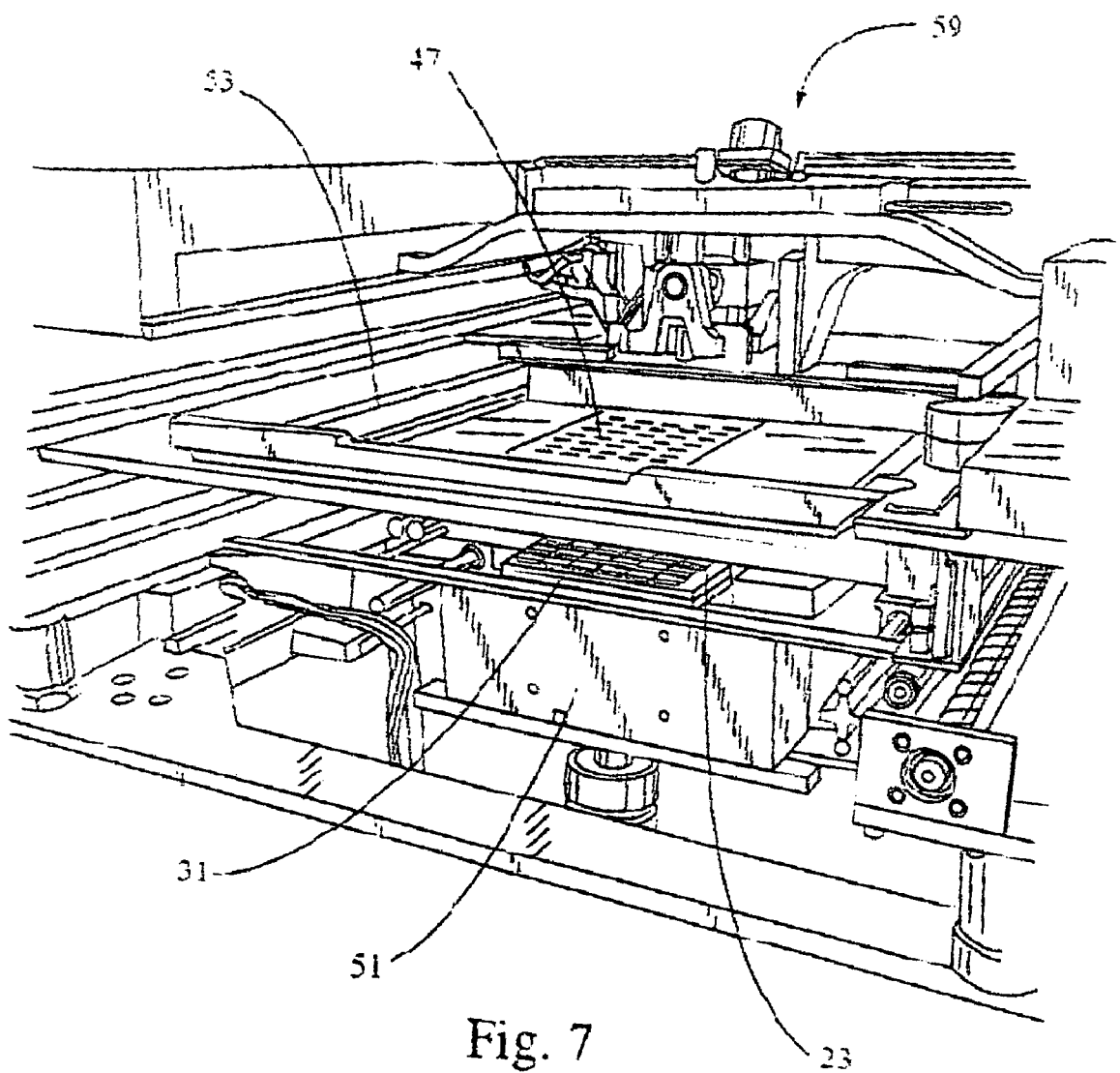
FIG. 7 is a view of the stenciling step of an embodiment of the present invention.

A preferred embodiment of the present invention may use, for example, an automated stencil printer for the stenciling process. As depicted in FIG. 6A, pallet 23 filled with chip carriers 21 with print fixture pedestal 31 positioned underneath it, is positioned on the work nest 51. Also, as noted above, when print fixture pedestal is joined to pallet 23, chip carriers 21 can be raised partially out of the top of chambers 25 of pallet 23. Referring next to FIG. 7, work nest 51 with the joined print fixture pedestal 31 and pallet 23 are positioned below the stencil 47. Stencil 47 may be positioned by an appropriate positioning apparatus with the aid of a special bidirectional camera (not shown) that is inserted between the stencil 47 and pallet 23 in a process well known in the art. The camera lines up the stencil and pallet by keying off of fiducials located on the stencil 47 and pallet 23. Once the machine assures correct alignment, print fixture pedestal 31 and pallet 23 can be raised by work nest 51 towards stencil 47 until the tops of the chip carriers 21, positioned in pallet 23, abut up against stencil 47. Work nest 51 has pneumatic means to raise and lower the entire structure. At this point solder deposition mechanism 59 can be lowered onto the top of stencil 47, and the solder can be deposited through the array of matrix holes 49 of the stencil. Matrix holes 49 expose the contact pads 46 of chip carriers 21 so that mechanism 59 can precisely deposit the solder on the contact pads. Once completed, mechanism 59 is raised from stencil 47 and stencil 47 is retracted upward. Because the chip carriers are securely held by the vacuum created between raised area 33 of print fixture pedestal 31 and the bottom of each of chip carriers 21 (see FIG. 6B), none of the chip carriers 21 should inadvertently stick to the stencil 47 as pallet 23 is retracted or lowered.

Figure 8:
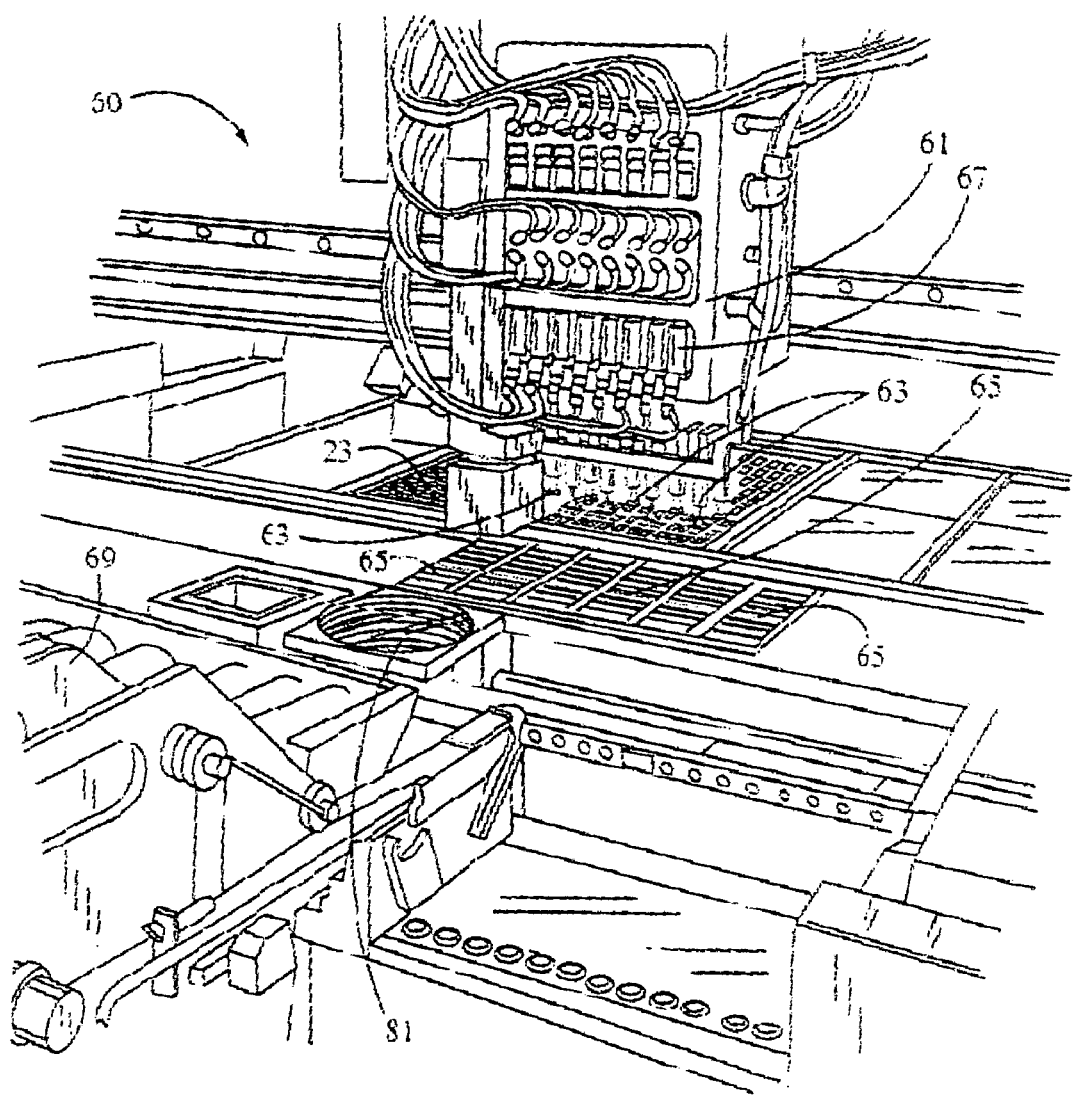
FIG. 8 is a view of the circuit board assembly step of an embodiment of the present invention.
Figure 9:
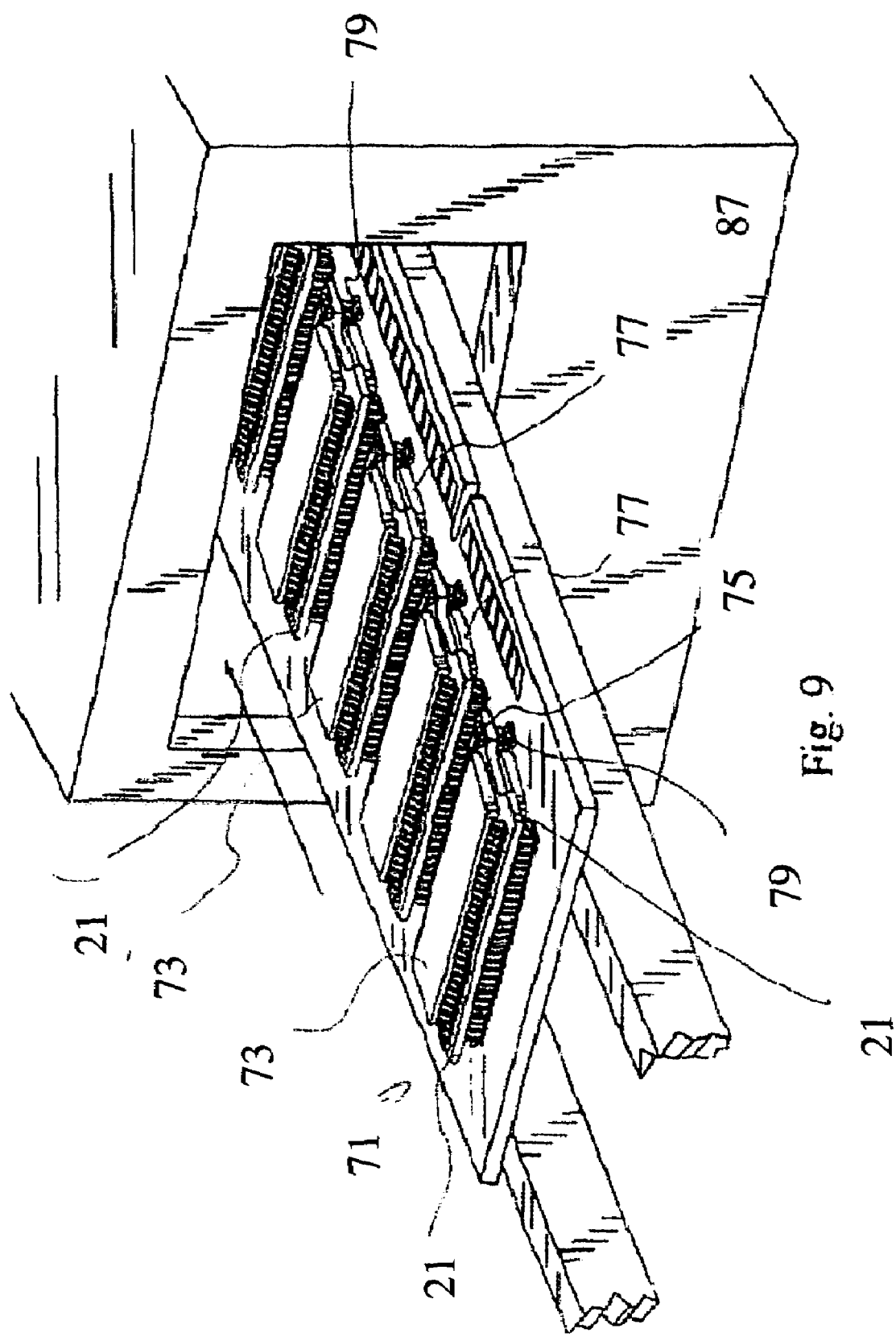
FIG. 9 is a side view of an oven used in the single reflow process of an embodiment of the present invention.

Once the stenciling process has been completed, pallet 23 can be disengaged from print fixture pedestal 31, and the pallet 23 with stenciled chip carriers 21 can be moved onto the next stage, the circuit board assembly process, as depicted, for example, in FIG. 8. In an embodiment of the circuit board assembly process, a standard "Pick and Place" machine 60 can be used. During the assembly process, a gantry 61 with various pick and place nozzles 63, first places semiconductor computer chips 73 (see FIG. 9) onto circuit board 65 together with various passive devices. The chips in FIG. 8 are taken from pallet 67, in a manner standard to the industry. Also, passive devices, i.e. resistors, capacitors, etc. come from rolls 69 in a manner standard to the industry. Once circuit board 65 is populated with the first layer of chips and passive devices, gantry 61 then begins placement of the chip carriers 21 that it takes from pallet 23. Upon completion of placement of all of the chip carriers 21 on circuit board 65, it begins placing the chips on the chip carriers 21 together with appropriate passive devices. FIG. 9 depicts a portion of a completed circuit board 65 with first layer of chips 73, passive devices 75, chip carrier 21, and second layer of chips 77 and passive devices 79 on the chip carriers 21. During the placement process each chip, chip carrier, and passive device placed on circuit board 65 is momentarily present to camera 81 (FIG. 8) for inspection. Any of these devices that appear on their surface to be defective can then be discarded.

The third and final step can be a heating process such as, for example, a reflow process during which the circuit board 65 with components attached is passed through an oven 87 to permanently attach the components to the board by melting the solder previously placed on the board and chip carriers. FIG. 9 depicts board 65 entering oven 87. Use of a single reflow process per side of each PCB avoids unduly stressing the circuit board and components attached to it, since circuit board 65 has all of the components placed on it before going through oven 87. In the preferred embodiment, a standard reflow oven is used. As is well known in the art, the single reflow oven causes the solder paste to melt and thus fuse the various components placed on the board to the board including the chip carriers. Naturally, the components are placed on each chip carrier to fuse to that chip carrier at the same time. One of the advantages of the present invention is that it allows all of the components, chips, chip carriers and passive components, for example, to be positioned in one step on the printed circuit board. Once in place, the board can be sent through an oven to melt the solder paste holding the components on the board and permanently to the board. This avoids the need to put the board through an oven more than two times. However, those skilled in the art, once they have reviewed this specification and understand the concepts of this invention, will be able to adapt any number of commercially available fabrication machines for the stenciling, assembly, or single reflow process.

Figure 10:
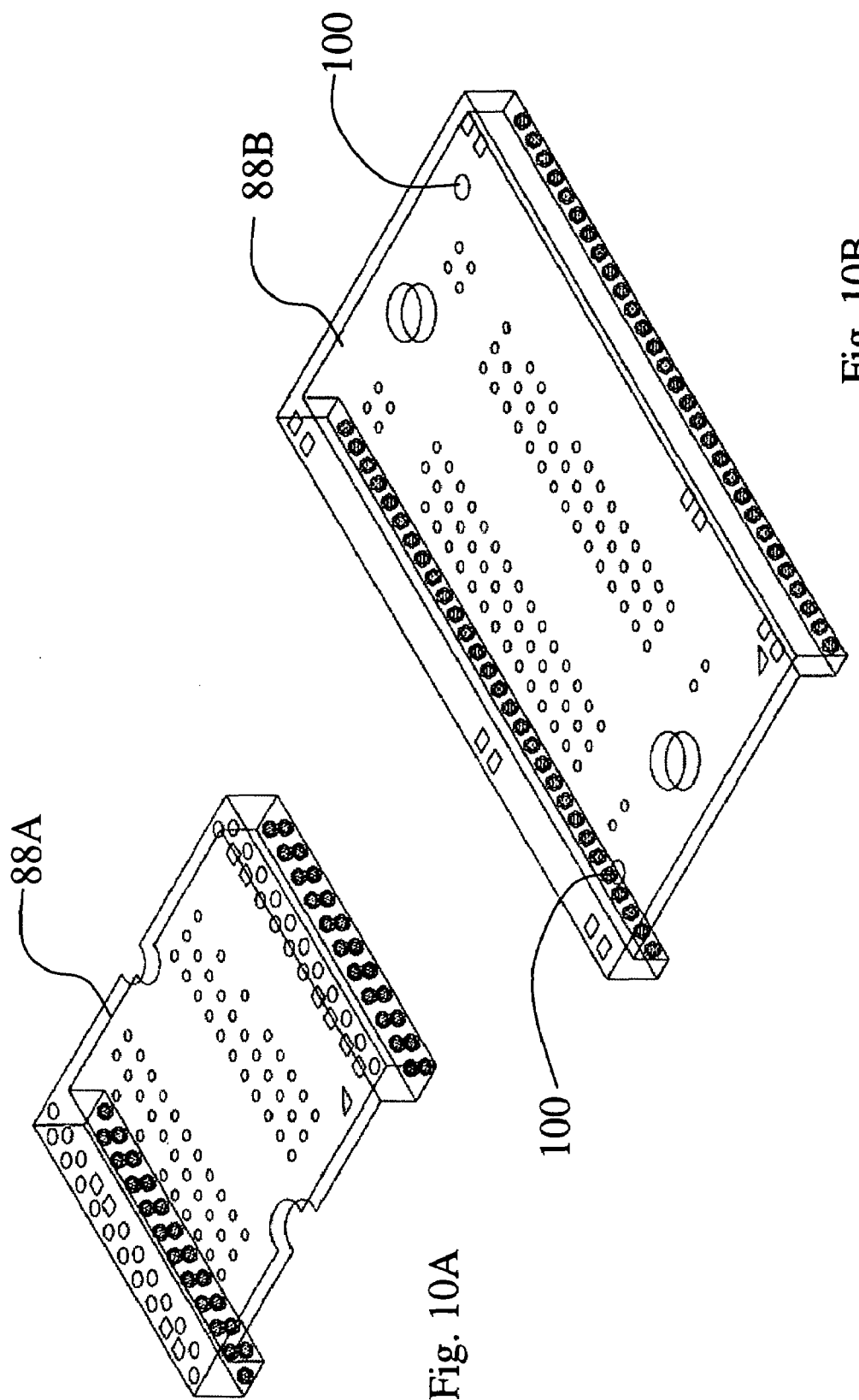
FIG. 10A shows chip carrier with two rows of BGA connectors as used in another embodiment of the invention.
FIG. 10B shows chip carrier with a single row of BGA connectors as used another embodiment of the invention.
Figure 11:
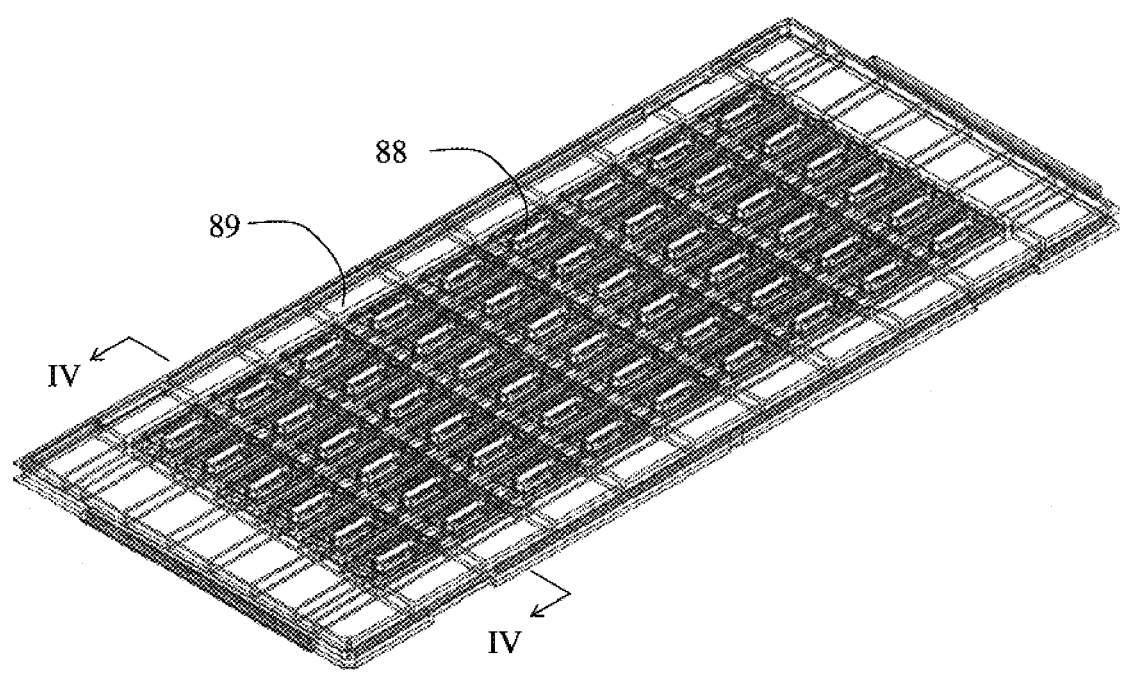
FIG. 11 shows another embodiment of a pallet that holds chip carriers during a manufacturing process.
Figure 12A:
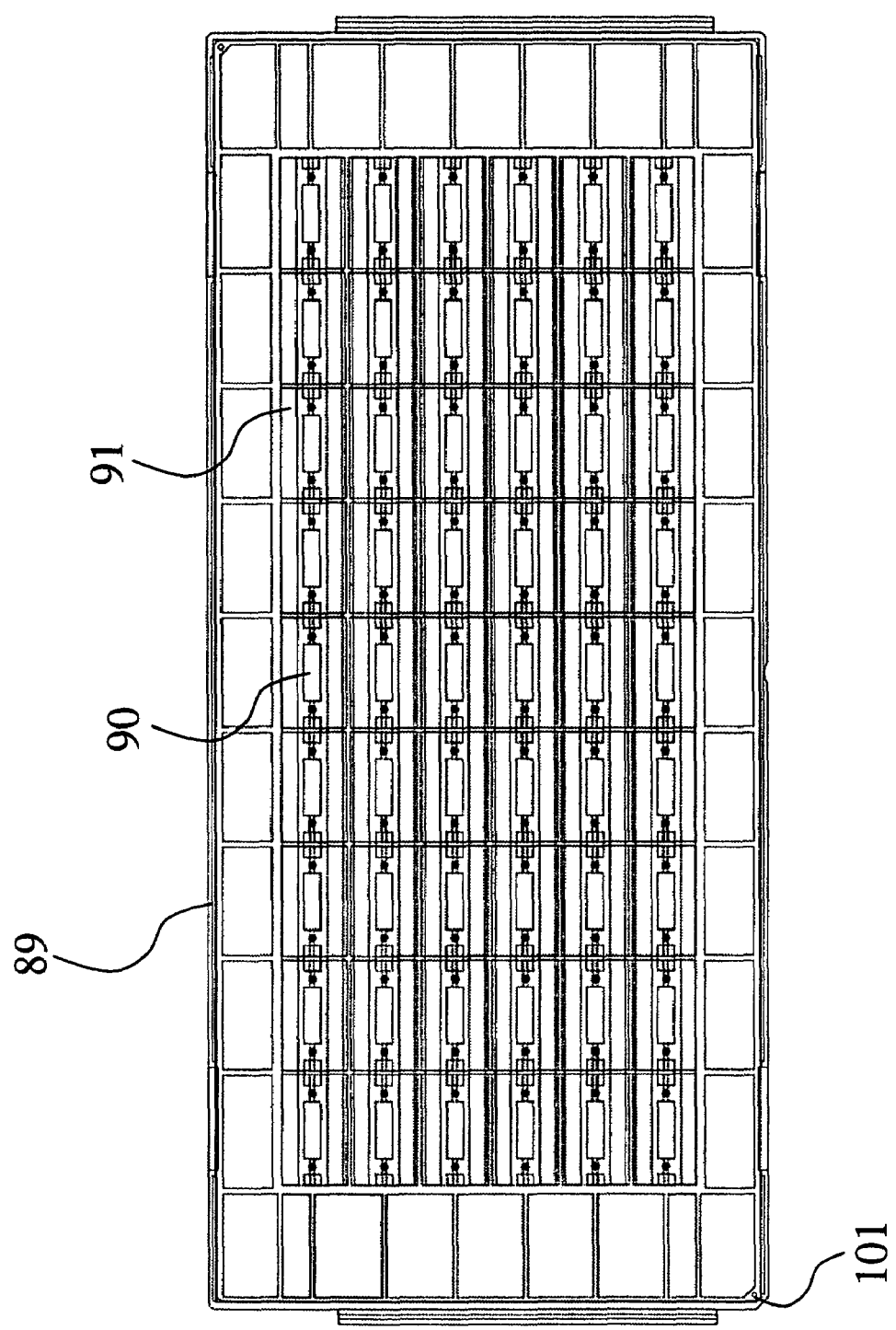
FIG. 12A is a top view of the pallet of FIG. 11.
Figure 12B:
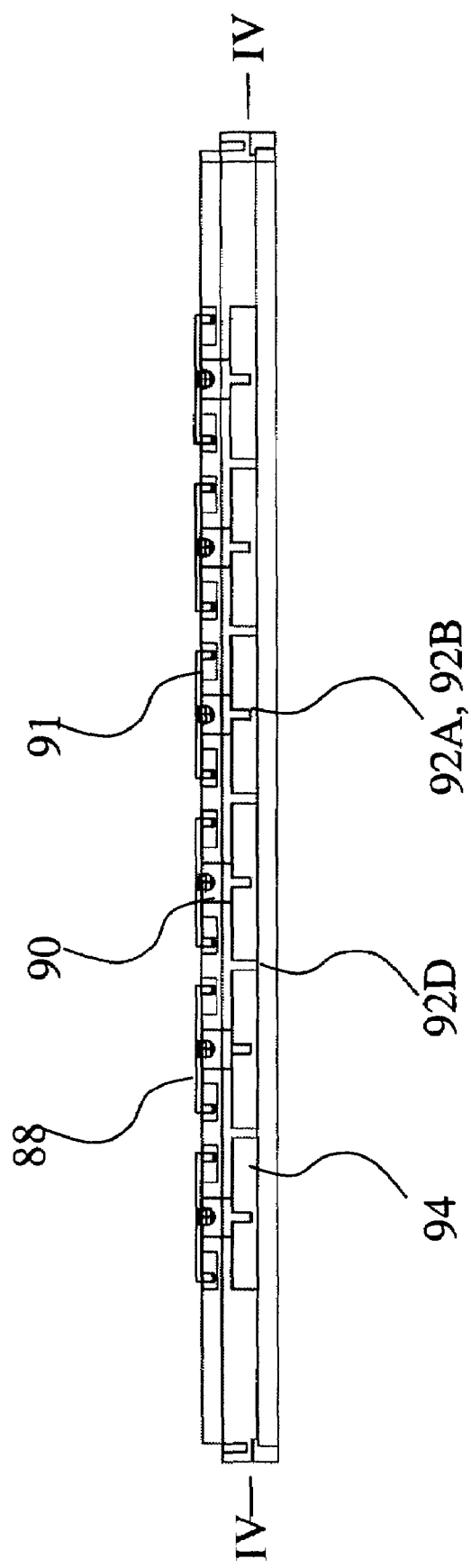
FIG. 12B is a cross-section view of the pallet shown in FIG. 11 along line IV-IV with chip carriers placed upon the pallet.
Figure 12C:
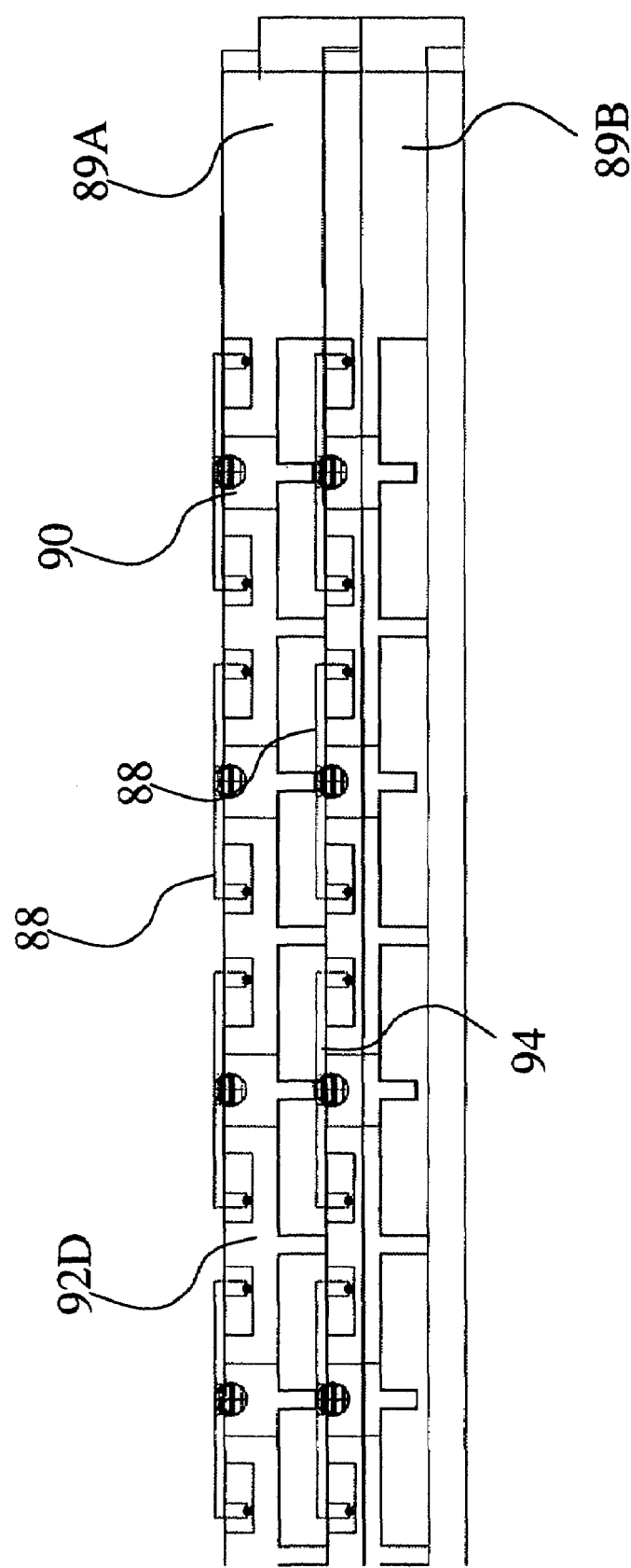
FIG. 12C shows, in cross section view, two pallets stacked one upon the other.

Another embodiment of the present invention is a pallet 89 shown in FIG. 11 that aids in, for example, holding, moving, storage and stenciling of one or more chip modules 88. The pallet 89, according to this embodiment, may hold a variety of chip modules 88, such as the chip carriers 21A shown in FIG. 1, chip carriers 88A shown in FIG. 10A and chip carriers 88B shown in FIG. 10B. Other chip carriers used by the embodiments of this invention are disclosed in U.S. patent application Ser. No. 10/371,061, entitled "Modular Integrated Circuit Chip Carrier," which is incorporated herein by reference in its entirety. FIG. 12A shows a top view of such a pallet 89. FIG. 12B shows a cross sectional view of the pallet 89 in FIG. 11 cut through the line IV-IV. FIG. 12C shows two such exemplary pallets 89 stacked one upon the other. These chip modules 88, may also comprise tooling holes.

The pallet 89, embodied in FIG. 11 and FIG. 12A comprises 54 chambers arrayed in a six by nine matrix of chambers. A variety of pallet configurations with any number of chambers may be used. Each chamber can hold an individual chip module 88. The bottom surface of a chip module 88 rests directly on the top surface 91 of the pallet 89. The chambers are also preferably open at the top and bottom of the pallet. The size of each chip module 88, in this embodiment can be greater than the size of each chamber in the pallet 89. This pallet may also comprises fiducials 101 as shown in FIG. 12A, which, in this embodiment, are located on two corners of the pallet 89. The fiducials 101 may be used by a bidirectional camera of an automated printer to key the location of the pallet in respect to the stencil. The pallet 89, described in these embodiments may also comprise, for example, tooling pins. These tooling pins may be included as part of the chamber and may be positioned to allow chip modules to rest thereon.

In this embodiment, chip modules may include chip carriers. FIG. 10A shows an exemplary chip carrier 88A with two rows of BGA leads on each side of the chip carrier 88A. FIG. 10B shows an exemplary chip module 88B with a single row of BGA leads on each side of the chip carrier 88B. Other chip carriers may also be used, such as those disclosed, for example, in published U.S. Patent Application 20030137808 entitled "Electronic Module having Canopy-Type Carriers," which is incorporated herewith by reference in its entirety.

FIG. 12A shows a top view of an exemplary pallet 89. The figure shows the top surface 91 where chip carriers rest within each chamber as well as openings 90 in the pallet. The length of the openings 90 in the chambers, in one exemplary embodiment, can be less than the length of a chip carrier 88. As will be discussed in more detail below, the openings in the chambers, for example, allow the chip carriers 88 to be held in place by a vacuum. The length of the openings 90 in the chambers, therefore, in this example, should be less than the length of a chip carrier 88.

FIG. 12B, in a side perspective, shows six chip modules 88 placed at six chambers of an exemplary pallet 89. This figure also shows the underbody of an exemplary chip module 88 resting on the top surface 91 of a pallet 89. The top surface 91 of the pallet 89 in this embodiment does not have abutments. The absence of abutments on the top surface 91 of the pallet 89 allows for unobstructed processing of the top of each chip module 88 during, for example, a surface mount assembly process or a stenciling process while the chip modules 88 are placed at a chamber of the pallet 89.

Figure 14:
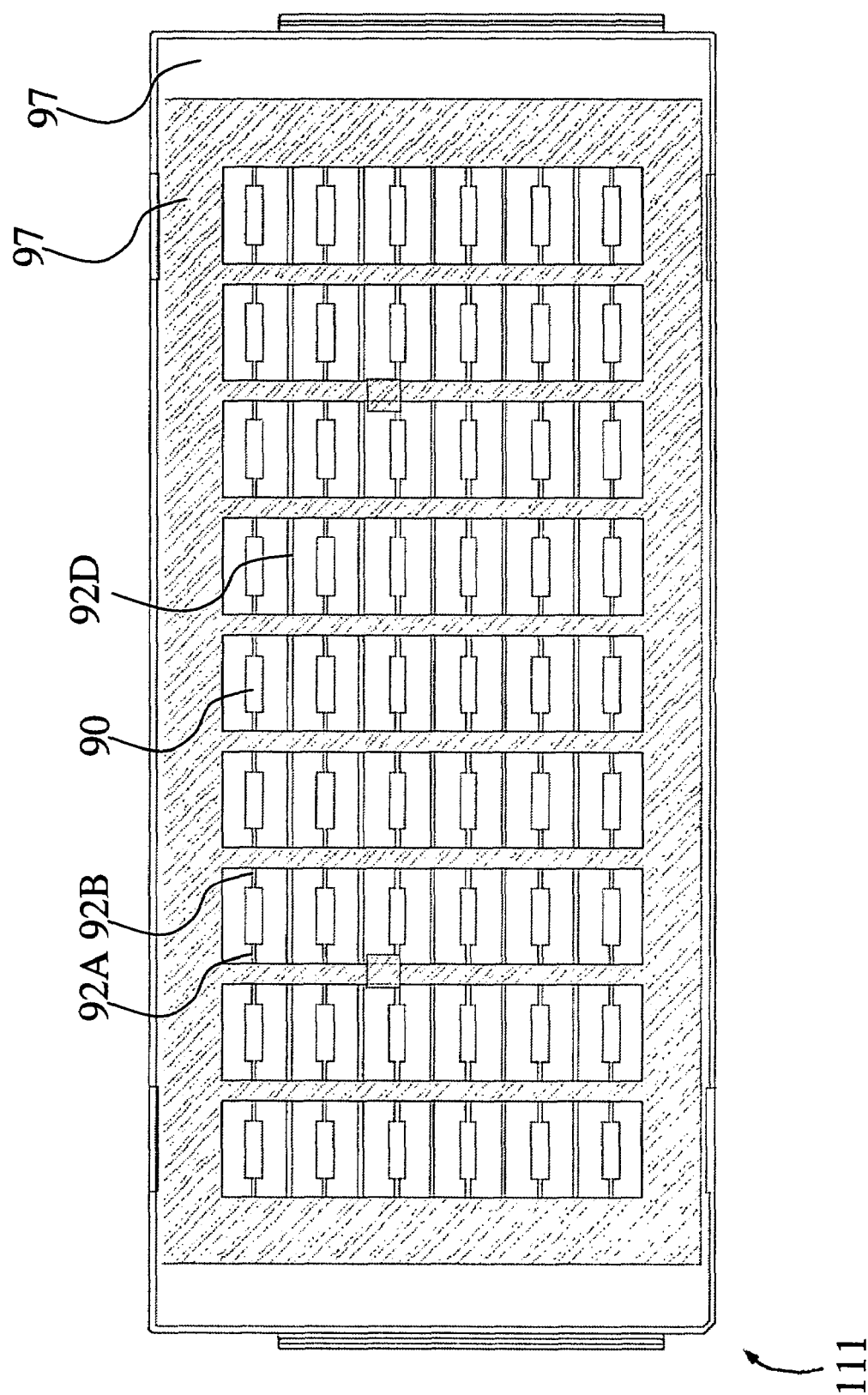
FIG. 14 is a view from the bottom of a print fixture with pallet in place according to another embodiment of the present invention.
Figure 16:
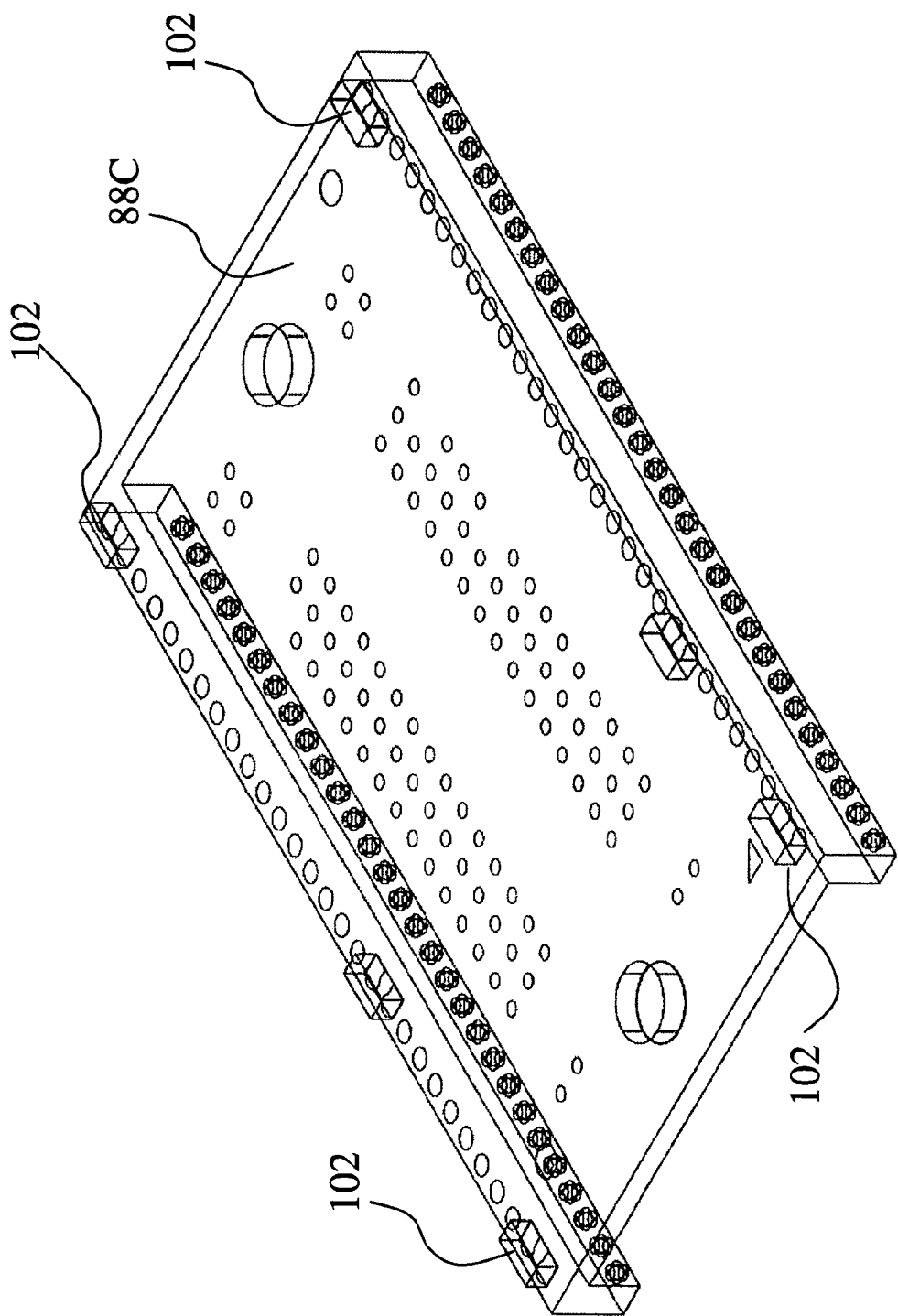
FIG. 16 shows a pre-processed chip carrier populated with passive components attached by solder interconnection according to another embodiment of the present invention.

The bottom surface of each chamber, in this embodiment, has four protrusions. FIG. 12C, which shows two pallets stacked one upon another, shows one protrusion 92D. FIG. 14 also shows a bottom view of a pallet and three protrusions 92A, 92B, and 92D. FIG. 12B shows protrusions 92A, 92B and 92D. These protrusions may be designed to hold and protect the chip modules 88 on the chambers, for example, when two or more pallets 89 are stacked one upon another as shown in FIG. 12C. In FIG. 12C, for example, the protrusions on the top pallet 89A form a recess within which a chip module 88 is housed when it is at a chamber on the lower pallet 89B. This recess 94 may provide protection for the chip module 88, for example, during storage, transportation, or movement. Protection of the chip module may be required, for example, when solder paste has been deposited on the top surface of the chip module 88 but the corresponding component has not yet been coupled and interconnected onto the chip carrier by the solder paste. This may be advantageous, for example, when the chip modules are being loaded and placed at a pick and place machine during the process described above or when the chip modules are stored or staged for periods of time after solder paste has been applied to interconnection pads of the chip module 88. Low-cost components may be placed on some of the pads and the chip module may then be stored prior to placement of any group-two components. By stacking a pallet on top of another pallet filled with chip modules that have solder paste applied thereon, the top pallet may protect the solder paste on the chip modules 88. The pallets, for example, can then be stacked and moved about without disturbing solder paste on the top of the chip modules. The protection of the chip carrier or chip carrier module may also be advantageous if pre-processed chip module 103 is stored in a pallet 89, as shown in FIG. 16. The stacking and handling features of the pallet preferably comply, for example, with JEDEC CO-032.

The pallet 89, for example, may be created from injected molded plastic or another durable plastic forming process. In another example, the pallet 89 may also be comprised of a metal such as aluminum. A variety of materials may be used for the pallet without deviating from the spirit of the present invention.

Figure 13A:
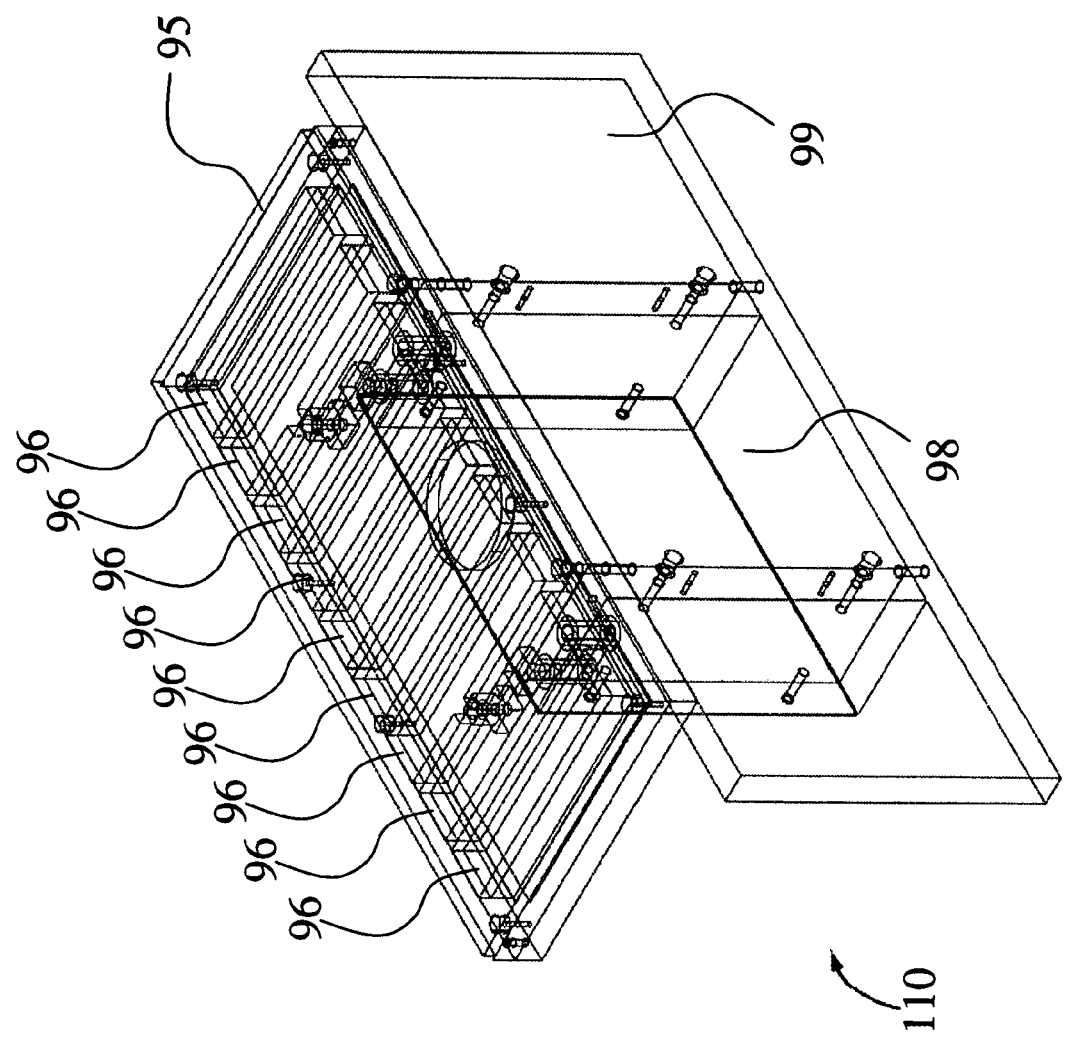
FIG. 13A shows a print fixture pedestal according to another embodiment of the invention.
Figure 13B:
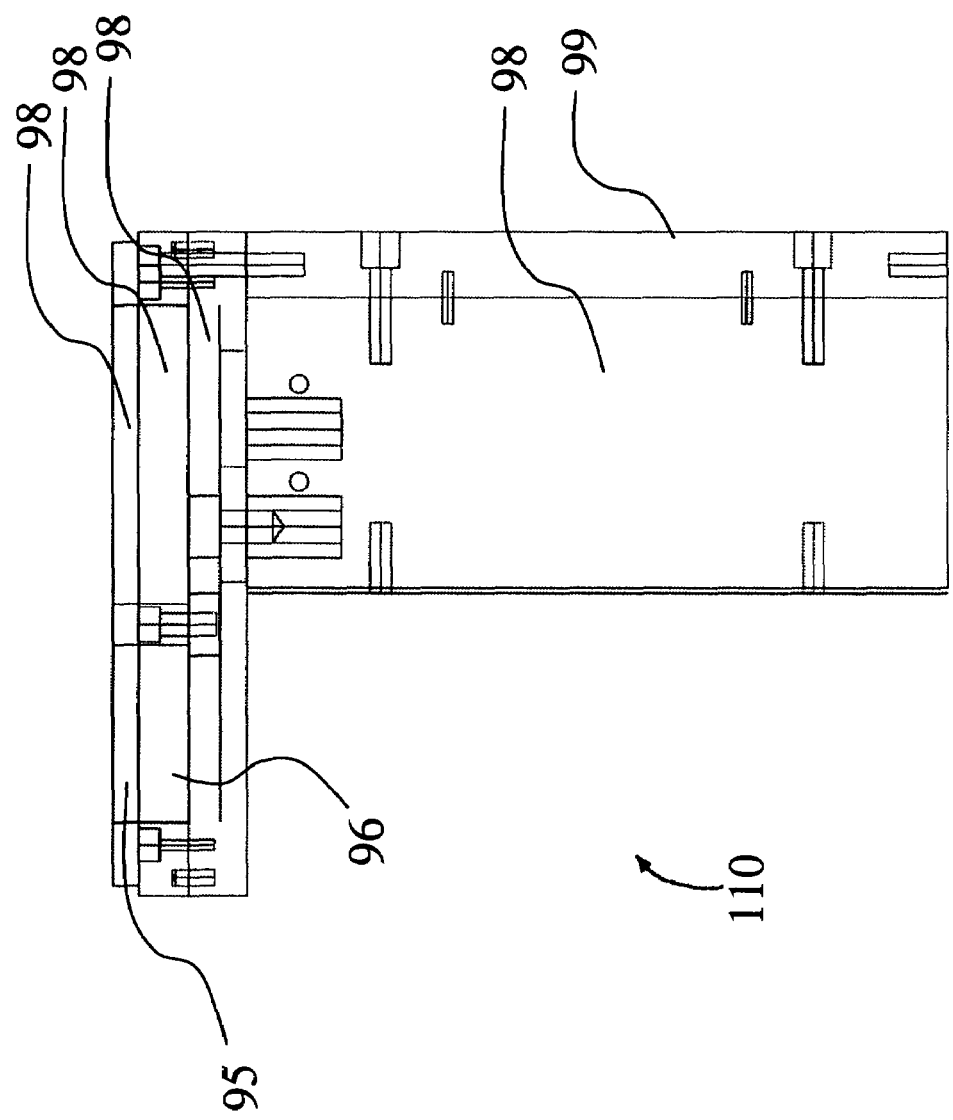
FIG. 13B is a left view of the print fixture pedestal of FIG. 13A.
Figure 15:
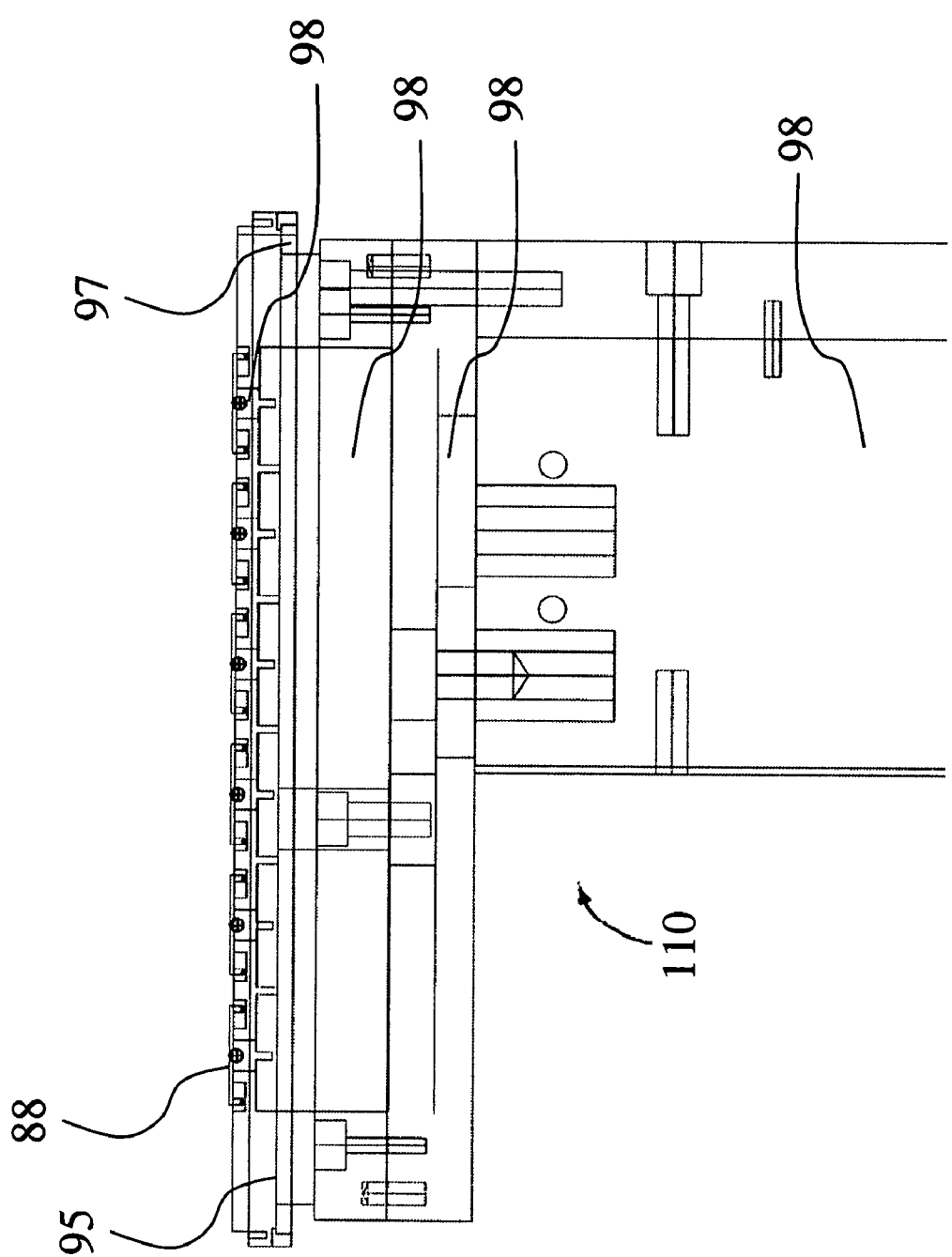
FIG. 15 shows the pallet in FIG. 11 coupled with a print fixture pedestal mounted on an H-tower according to another embodiment of the present invention.

Another embodiment of the present invention is a print fixture pedestal 110 as shown in FIGS. 13A and 13B. In this figure an exemplar print fixture pedestal 110 is coupled with an industry standard H-tower 99. The print fixture pedestal may, for example, have a single raised block area 95 as shown in FIG. 13A and FIG. 13B. These block like areas 95 can match the matrix of chambers in a pallet. These block like areas 95 may also be designed and sized, for example, to fit into the bottom of a pallet as shown in FIG. 15. A cross-sectional side view of the print fixture pedestal 110 in this embodiment is shown in FIG. 13B. The print fixture pedestal 110 may be coupled with a pallet 89 for chip module processing. The print fixture pedestal 110 may, for example, have a single raised block area 95 which matches the matrix of chambers in a pallet 89. This raised block area 95 can be designed to fit into the bottom of a pallet 89.

FIG. 13B is a cross-sectional side view of an embodiment of a print fixture pedestal that shows the hollow interior 98 of the print fixture pedestal. In this figure the raised block area 95 of a pedestal 110 is shown as well as a matrix of chambers 96 that open into the raised block area 95. The print fixture pedestal may also have a hollow interior region 98 and openings into the hollow interior of the H-tower 99. The bottom of the print fixture pedestal 110 can be secured to a hollow shaft of an H-tower 99 by standard methods. The H-Tower shaft 99 may open into the hollow interior 98 of the print fixture pedestal 110. The print fixture pedestal 110 in this example can be made, for example, of aluminum. The print fixture pedestal 110 may be made of any other suitable material and is not limited to the exemplary embodiment described here.

FIG. 14 shows a bottom view of the upper surface 111 of an exemplary print fixture pedestal. In this view, some of the pallet may be seen through the upper plate of the print fixture pedestal.

FIG. 15 shows how this exemplary print fixture pedestal 110 is designed so that the raised portion 95 of the print fixture pedestal 110 fits within the bottom surface 97 of a pallet 89. FIG. 6B shows how the pedestal can abut with the bottom of a chip carrier 88 through the opening 90 in the pallet 89. A print fixture pedestal 101 can secure a chip module 88 at a chamber of a pallet without disturbing the chip module 88. When the print fixture pedestal 101 of the current embodiment is joined with a pallet 89, for example, the pallet 89 shown in FIG. 11, the perimeter of the upper surface 95 of the pedestal of the print fixture pedestal 110 can then form a gasket-like seal against the bottom 97 planar surface of the pallet 89. This gasket like seal frames the array of chambers enabling a vacuum that holds the chip carriers 88 in place. This vacuum seal on the chip module 88 can secure the chip module at the pallet during a manufacturing process, such as a stenciling process. In such an embodiment, the print fixture pedestal 110 may also be connected to a vacuum at the print machine that is used to create the vacuum seal in between the pedestal 110 and the pallet 89 and chip modules 88.

An exemplary stencil is shown in FIG. 5. This stencil may use an automated printer as described in reference to FIG. 7. The stencil 47 may be positioned using a standard bidirectional camera keying off fiducials 100 found on the chip carrier 88 as shown in FIG. 10 or fiducials 101 on the pallet as shown in FIG. 11 and FIG. 12A and the matching set on the stencil 47. When a print, stencil, placement, or other manufacturing process is complete, the vacuum holds the chip modules 88 in place to ensure that they do not inadvertently stick to the stencil as the pallet is retracted or lowered.

Once a manufacturing process, such as a stenciling process, is complete the pallet 89 may then be disengaged from the print fixture pedestal and moved to another stage of processing, such as, for example, the circuit board assembly process depicted in FIG. 8. In such an embodiment, the pallet can be positioned on the tray table or tray feeder of a "Pick and Place" machine; where the chip carriers can be transferred to a printed circuit board by a three dimensional assembly process. Alternatively, a heating process such as, for example, a reflow process may follow.

Another embodiment of the present invention is a method of pre-processing chip modules with, for example, group-one components, storing the preprocessed chip modules until placement on a circuit board is required, and then populating the chip module with group-two components, usually, for example, at the time of assembly of a three dimensional array of chips. The definition of a group-two component will depend on factors, such as, for example, the cost, cost to inventory the chips and/or the populated chip modules, industry, market, and amount of time the chip modules will be stored. Because many electronic components, such as, for example, memory modules, may be subject to large price fluctuations wherein the price of the components decrease drastically over time, even in short periods of time, placing such a component, for example, on a chip carrier early in the processing cycle may be economically unwise. Group-one components on the other hand are those components not considered group-two components. Thus, it would not be cost efficient to preprocess a chip module with group-two components if that group-two component may likely cost less when the chip module is being assembled onto the circuit board. However, pre-processing a chip module with group-one components, for example, low cost components, storing the preprocessed module, and then placing the group-two components onto the chip module at the time the chip module is placed on the circuit board would be more cost efficient. Furthermore, storing expensive group-two components in inventory may also affect business decisions and raise overhead. The chip placement or three dimensional assembly process may be sped up because the chip module already has many of the components placed thereon prior to assembly. Some of the factors that lead to defining a group-two component may further include the market, historical cost trends, present cost, supply, demand, availability, complexity, sensitivity, durability, process considerations, cost, etc.

Resistors and capacitors, for example, may be considered group-one components. IC memory chips may, for example, be considered group-two components. These designations are exemplary only and may change as the industry changes and component pricing changes.

Figure 17:
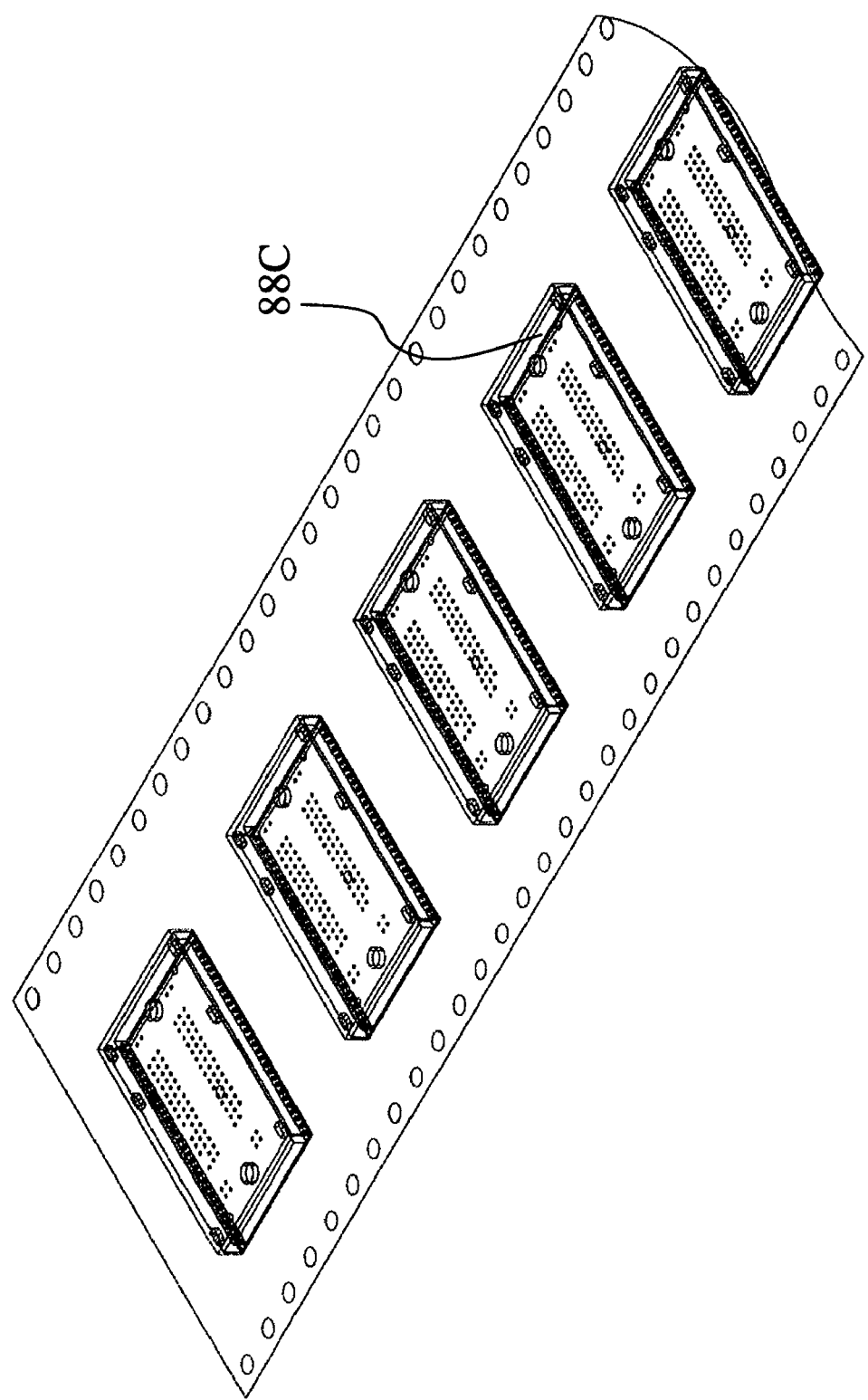
FIG. 17 shows five pre-processed chip carriers packaged in a tape for later placement by a pick and place machine according to another embodiment of the present invention.

FIG. 16 shows a pre-processed chip carrier 88C, which is similar to carrier 88B, as shown in FIG. 10B, with components 102. This pre-processed carrier is pre-populated with components 102, such as, for example, capacitors. One exemplary process may include, applying flux, solder or other materials for forming an interconnect to every interconnection pad, a plurality of interconnection pads, or only those pads upon which group-one components will be placed, such as the pads under the components 102 shown in FIG. 16. This may include use of the pallet and pedestal. Group-one components may then be interconnected to their corresponding pads. This may be followed by the application of tacky flux to interconnection pads of group-two components. Alternatively, tacky flux may be applied to pads as required. Finally, according to this exemplary embodiment, the chip carriers can then be stored until final assembly. The chip carriers may be stored in a tape and reel or on the pallet and potentially stacked with other pallets of chip carriers. The pre-processed chip carriers 88C in tape and real or pallet may also be stored in a sealed vapor barrier bag. FIG. 17 shows five preprocessed chip carriers 88C placed in a tape and reel. The preprocessed chip carriers 88C may be stored at 27° C. for up to about six months or longer as needed.

When a circuit board is being populated with components, the preprocessed chip carrier may be loaded at a surface mount technology placement machine. The chip carriers may be picked from a tape and reel or from a pallet depending on how they were stored. A chip carrier may then be placed on the circuit board over an IC chip and/or other passive components. After which an IC chip and/or other passive components may be placed on the chip carrier. During these placement processes application of solder to the chip carrier can be obviated by pre-processing. Flux may be applied to group-two components by a dip process, for example, an industry standard dip process. Pre-processing may obviate the necessity of a dip process.

Figure 18:
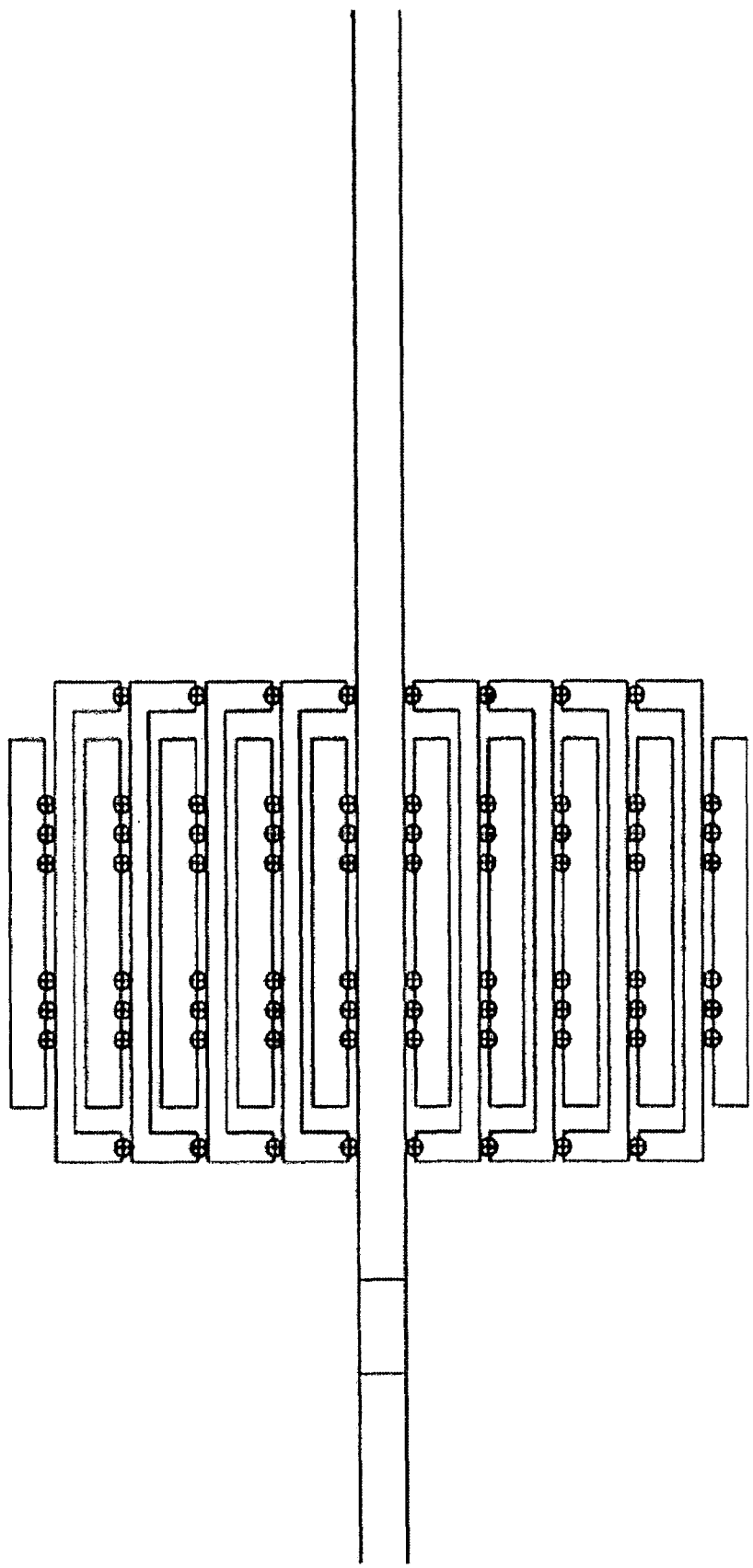
FIG. 18 is a side view of a circuit board with four chip carriers and five integrated circuit (IC) chips stacked on each side of the circuit board according to another embodiment of the present invention.

Chip carriers may be stacked on top another as shown in FIG. 18. Accordingly, in the embodiment discussed above a chip carrier may be placed atop a first chip carrier after an IC chip has been placed on the chip carrier. FIG. 18 shows an example of 4 chip carriers stacked one upon another on both sides of a circuit board. This process may be limited by the vertical physical room allowed in a specific use, the internal circuitry of the components, and the physical limitations on the circuit board. Thus, chip carriers may be stacked beyond four. Indeed, one embodiment stacks six chip carriers. Further, any number of chip carriers may be stacked one upon the other.

Another pre-processing embodiment may, for example, comprise the following steps. First, solder paste or other material serving the same function may be applied to the upper surface of the chip carrier. Solder coverage may include all pads. The solder paste or equivalent material may alternatively be applied only to those devices, such as resistors or capacitors, having no solder or insufficient solder on their own terminations for formation of acceptable electrical interconnections during a heating process such as, for example, a reflow process. Second, components selected for pre-processing such as group-one components may be placed on the chip carrier and reflowed. Third, solder deposits on unpopulated pads can be flattened. Fourth, tacky flux can be applied to the land patterns of unpopulated pads. Fifth, the chip carriers can then be packed in a tape and reel, as shown in FIG. 17, or in trays similar to those shown in FIG. 11 and then, sealed in vapor tight bags, and may be stored at 27° C. for up to six months. Each step in the above method is exemplary. Indeed the third step, for example, may be removed or altered.

A surface mount technology (SMT) process may further include the following steps. The SMT step may involve placing a tape and reel containing the chip carriers on a feeder at the SMT placement machine, picking a chip carrier with a nozzle, visioning and placing the chip carrier over an IC chip and/or other passive devices such as capacitors or resistors, for example, that have been placed directly on the circuit board. Placing packaged or unpackaged integrated chips or other chip carriers on the chip carriers and then performing a heating or reflow process with the chip carriers.

Another embodiment of the present invention may include the loading of a pallet at a SMT placement machine table or tray feeder instead of the tape and reel. The remainder of the SMT process may be similar to the first embodiment described above.

The embodiments described above may provide, for example, 1) a simplified robust setup of the vacuum pedestal at the printer by changing the number of interleaving chambers from fifty four to one and increasing the setup positional tolerances from $<\pm 1$ mm to $\sim \pm 4$ mm; 2) lowered cost of pallets, by, for example, use of molding processes; 3) adaptation of the tray to, for example, meet JEDEC standards for use with standard tray handling equipment enabling greater automation of a process.

Furthermore, co-pending U.S. application Ser. No. 10/098,269 is incorporated herein by reference in its entirety. This application provides certain exemplary process information regarding, for example, the automated build of a three dimensional circuit board with packaged and or unpackaged integrated circuit chips or other chips. The processes and embodiments described herein, for example, may include: 1) the availability of ready to use partially prepared chip carriers; and 2) the ability to reduce a three step process to a standard process on a high volume surface mount technology (SMT) assembly line configuration, where a specialized tray feeder or tray table machine may not be required.

Although the invention has been particularly shown and described with reference to preferred embodiments thereof, it will be understood by those skilled in the art that various changes in form and detail may be made to it without departing from the spirit and scope of the invention.

What is claimed is:

1. A system for populating circuit boards with a three dimensional array of semiconductor chips comprising:
   one or more chip carriers attachable to a circuit board comprising:
   a top surface;
   a bottom surface;
   space for one or more components to be positioned directly on said circuit board beneath said chip carrier; and
   space for positioning one or more components on the top surface of said chip carrier; and
   a pallet comprising one or more chambers for holding and moving said chip carriers during a circuit board assembly process, each chamber comprising a top surface;
   wherein said chip carriers are placed in said pallet with the bottom surface of said chip carrier placed on the top surface of said chamber.

2. The system of claim 1 wherein said chip carriers further comprise connections selected from the group consisting of gull wing leads, single row BGA, and double row of BGA.

3. The system of claim 1 wherein said chip carriers comprise:
   two struts with vias extending from the top surface to the bottom of the strut;
   a pattern of connection pads on its top surface that are interconnected to said vias; and
   one or more BGAs on the bottom of said struts.

4. The system of claim 1 wherein said chamber further comprises an opening at the top and bottom side of said pallet.

5. The system of claim 1 wherein said pallet further comprises a bottom side protective cavity that protects a chip carrier in a recessed position when a chip carrier is positioned at a chamber and two pallets are stacked one upon the other.

6. The system of claim 5 wherein said bottom side protective cavity further comprises a plurality of protrusions around the outside bottom periphery of said chambers.

7. The system of claim 6 wherein when two pallets are stacked one upon another the top surface of said chip carriers are above the bottom of said protrusions on the bottom of said pallet causing a protective cavity for said chip carrier.

8. The system of claim 1 wherein said chambers comprise openings on the top surface thereof; and wherein the length of the openings in said chambers are less than the length of a chip carrier.

9. The system of claim 1 wherein said chip carriers comprise tooling holes and said chambers comprise tooling pins; and wherein said bottom side protrusions are positioned such that when a chip carrier is on said chamber tooling pins, the top surface of said carrier is above the bottom of said protrusions of the pallet above and thereby protected by said protrusions from unintended alteration.

10. The system of claim 1 further comprising a print fixture pedestal comprising a planar surface with at least one aperture positioned to fit beneath said chambers in said pallet, wherein said print fixture pedestal abuts to the bottom of said chamber.

11. The system of claim 10 wherein the pedestal securely holds said chip carriers with a vacuum when said aperture is positioned beneath said pallet.

12. The system of claim 1 wherein said pallet further comprises a plurality of chambers arranged in a two dimensional matrix.

13. The system of claim 12 wherein said print fixture pedestal further comprises a planar matrix array of openings positioned such that each open portion corresponds to a column of chambers in said two dimensional matrix of chambers so that when said print fixture pedestal is positioned under said pallet each opening aligns with the bottom opening of an adjacent column of chambers.

14. The system of claim 1 wherein said chambers are open on the bottom side of said pallet.

* * * * *

UNITED STATES PATENT AND TRADEMARK OFFICE
CERTIFICATE OF CORRECTION

PATENT NO.       : 7,337,522 B2                                      Page 1 of 1
APPLICATION NO.  : 11/270317
DATED            : March 4, 2008
INVENTOR(S)      : Engle et al.

It is certified that error appears in the above-identified patent and that said Letters Patent is hereby corrected as shown below:

On the Title Page,
Item (63) Continuation-in-part of application No. 10/098,269, filed Mar. 14, 2002, now Pat. No. 7,103,970, and a continuation-in-part of application No. 10,371,061, filed Feb. 21, 2003, now Pat. No. 7,102,892, and a continuation-in-part of application No. 10,648,029, filed on Aug. 26, 2003, which is a continuation of 09/688,500, filed on Oct. 16, 2000, now Pat. No. 6,713,854.

Signed and Sealed this

Seventeenth Day of June, 2008

JON W. DUDAS
*Director of the United States Patent and Trademark Office*